US012787374B2

(12) United States Patent
Wu

(10) Patent No.: US 12,787,374 B2
(45) Date of Patent: Nov. 3, 2026

(54) SEMICONDUCTOR DEVICE WITH TOP DIELECTRIC LAYER AND METHOD FOR FABRICATING THE SAME

(71) Applicant: NANYA TECHNOLOGY CORPORATION, New Taipei (TW)

(72) Inventor: Chun-Heng Wu, New Taipei (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 338 days.

(21) Appl. No.: 18/631,408

(22) Filed: Apr. 10, 2024

(65) Prior Publication Data

US 2025/0301721 A1 Sep. 25, 2025

Related U.S. Application Data

(62) Division of application No. 18/613,392, filed on Mar. 22, 2024.

(51) Int. Cl.
*H10B 12/00* (2023.01)
*H10D 62/10* (2025.01)
(Continued)

(52) U.S. Cl.
CPC ........... *H10D 62/102* (2025.01); *H10B 12/03* (2023.02); *H10B 12/482* (2023.02);
(Continued)

(58) Field of Classification Search
CPC ........ H10B 12/01; H10B 12/02; H10B 12/03; H10B 12/033; H10B 12/0335;
(Continued)

(56) References Cited

U.S. PATENT DOCUMENTS

2023/0328970 A1* 10/2023 Lai ........................ H10B 12/488 257/213
2023/0411443 A1 12/2023 Oguz et al.
2025/0301720 A1* 9/2025 Wu ...................... H10B 12/482

FOREIGN PATENT DOCUMENTS

CN 110752212 A 2/2020
TW 201301392 A 1/2013
(Continued)

OTHER PUBLICATIONS

Office Action and and the search report mailed on May 29, 2025 related to Taiwanese Application No. 113119692.
(Continued)

*Primary Examiner* — Reema Patel
(74) *Attorney, Agent, or Firm* — Xuan Zhang

(57) ABSTRACT

The present application discloses a semiconductor device and a method for fabricating the semiconductor device. The semiconductor device includes a substrate; a landing pad positioned over the substrate; a top dielectric layer including a flat portion positioned on a top surface of the landing pad, and a cavity portion connecting to the flat portion, surrounding the landing pad in a top-view perspective, recessing toward the substrate in a cross-sectional perspective, and including a U-shaped cross-sectional profile, resulting in a cavity with a broadened opening; and a filling layer positioned on the top dielectric layer and filling the cavity. A width of the cavity and a width of the broadened opening are substantially the same.

10 Claims, 39 Drawing Sheets

(51) Int. Cl.
*H10D 64/01* (2025.01)
*H10W 20/41* (2026.01)
*H10W 20/48* (2026.01)

(52) U.S. Cl.
CPC ........ *H10D 64/018* (2025.01); *H10W 20/435* (2026.01); *H10W 20/48* (2026.01)

(58) Field of Classification Search
CPC . H10B 12/315; H10B 12/482; H10W 20/435; H10W 20/48; H10W 20/46
See application file for complete search history.

(56) References Cited

FOREIGN PATENT DOCUMENTS

| | | |
|---|---|---|
| TW | I803361 B | 5/2023 |
| TW | I809866 B | 7/2023 |

OTHER PUBLICATIONS

Summary translation of Office Action and and the search report mailed on May 29, 2025 related to Taiwanese Application No. 113119692.

* cited by examiner

SEMICONDUCTOR DEVICE WITH TOP DIELECTRIC LAYER AND METHOD FOR FABRICATING THE SAME

CROSS-REFERENCE TO RELATED APPLICATION

This application is a divisional application of U.S. Non-Provisional application Ser. No. 18/613,392 filed Mar. 22, 2024, which is incorporated herein by reference in its entirety.

TECHNICAL FIELD

The present disclosure relates to a semiconductor device and a method for fabricating the semiconductor device, and more particularly, to a semiconductor device with a top dielectric layer and a method for fabricating the semiconductor device with the top dielectric layer.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a top dielectric layer including a flat portion positioned on a top surface of a landing pad; and a cavity portion connecting to the flat portion, surrounding the landing pad in a top-view perspective, and including a U-shaped cross-sectional profile in a cross-sectional perspective, resulting in a cavity with a broadened opening. A width of the cavity and a width of the broadened opening are substantially the same.

Another aspect of the present disclosure provides a semiconductor device including a substrate; a landing pad positioned over the substrate; a top dielectric layer including a flat portion positioned on a top surface of the landing pad, and a cavity portion connecting to the flat portion, surrounding the landing pad in a top-view perspective, recessing toward the substrate in a cross-sectional perspective, and including a U-shaped cross-sectional profile, resulting in a cavity with a broadened opening; and a filling layer positioned on the top dielectric layer and filling the cavity. A width of the cavity and a width of the broadened opening are substantially the same.

Another aspect of the present disclosure provides a method for fabricating a semiconductor device including forming a landing pad over a substrate; forming a top dielectric layer covering the landing pad, wherein the top dielectric layer includes a flat portion on a top surface of the landing pad and a cavity portion surrounding the landing pad, the cavity portion includes a U-shaped cross-sectional profile, resulting in a cavity with an opening, and a width of the opening is less than a width of the cavity; partially filling the cavity with a protecting element; broadening the opening into a broadened opening, wherein the width of the cavity and a width of the broadened opening are substantially the same; removing the protecting element; and forming filling layer on the top dielectric layer and filling the cavity.

Due to the design of the semiconductor device of the present disclosure, the cavity may be completely filled by the filling layer so that the underlying air gaps may be properly protected. Hence, the risk of exposure during subsequent processes such as capacitor formation may be eliminated. Consequently, defects such as leakage between the capacitor and the bit line structure in the semiconductor device may be reduced. Furthermore, due to the broader broadened opening, the filling layer may easily fill the cavity. As a result, the complexity and time for fabricating the semiconductor device may be reduced.

The foregoing has outlined rather broadly the features and technical advantages of the present disclosure in order that the detailed description of the disclosure that follows may be better understood. Additional features and advantages of the disclosure will be described hereinafter and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
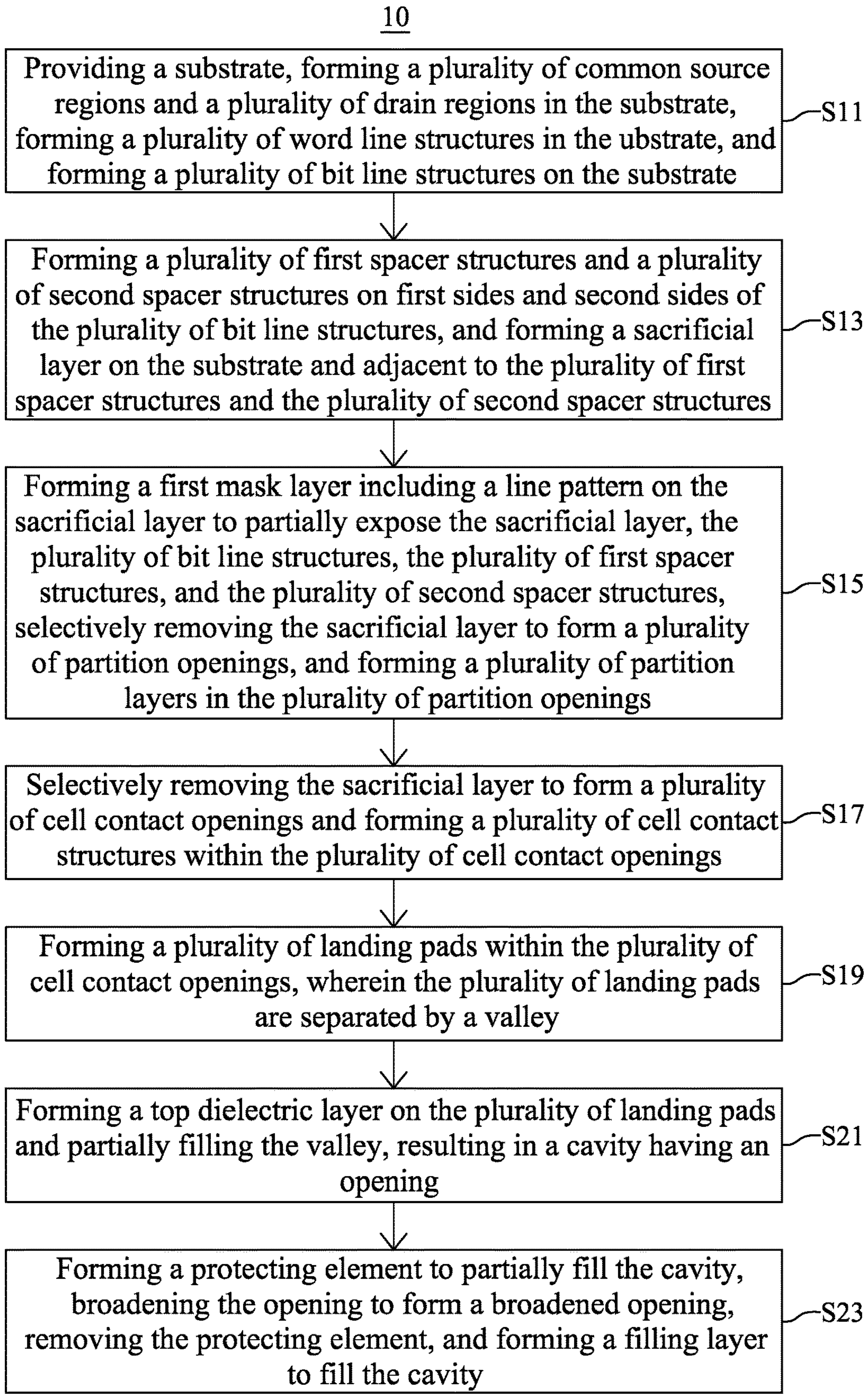
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being “connected to” or “coupled to” another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as “same,” “equal,” “planar,” or “coplanar,” as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term “substantially” may be used herein to reflect this meaning. For example, items described as “substantially the same,” “substantially equal,” or “substantially planar,” may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Figure 2:
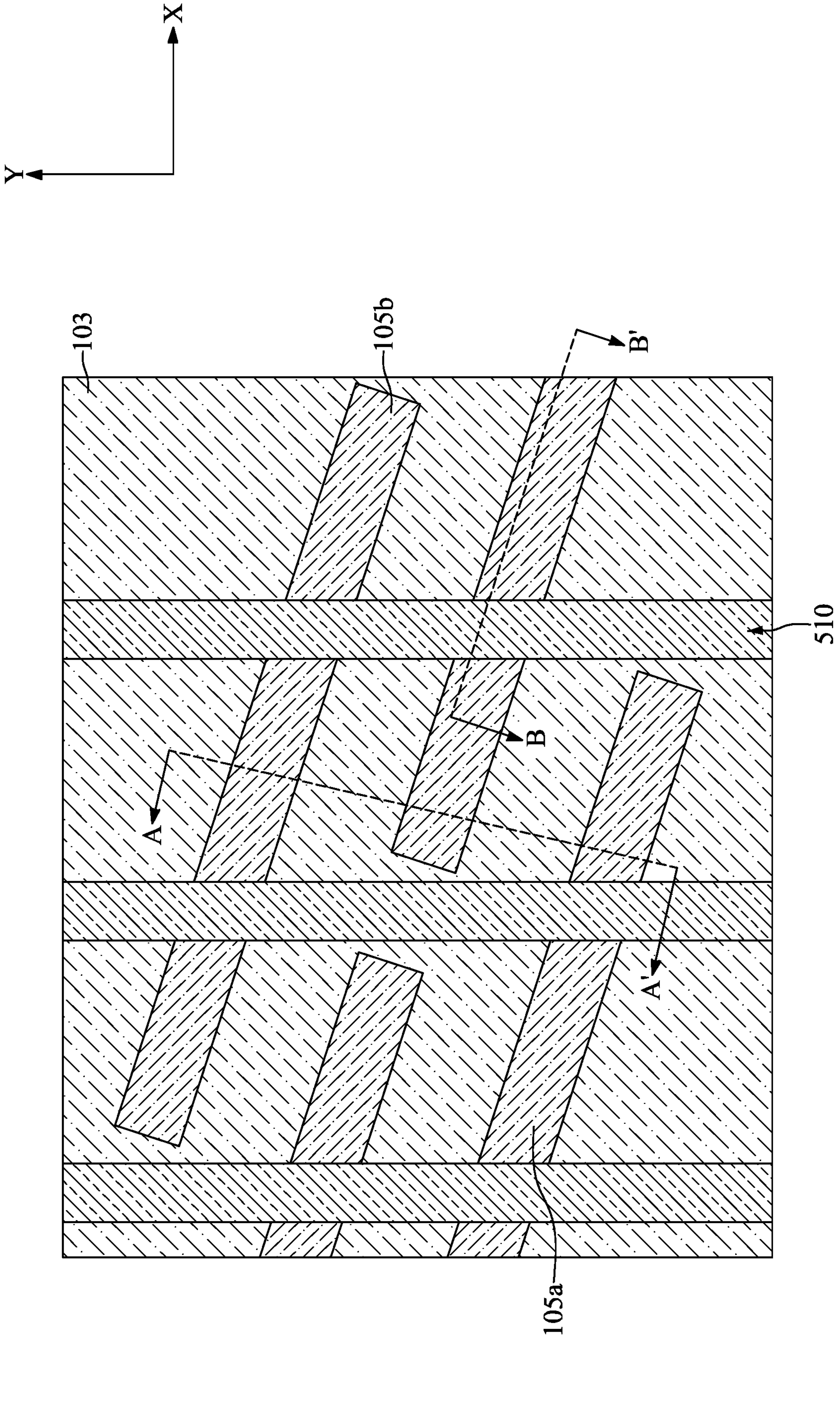
FIG. 2 illustrates, in a schematic top-view diagram, an intermediate semiconductor device in accordance with one embodiment of the present disclosure.
Figure 3:
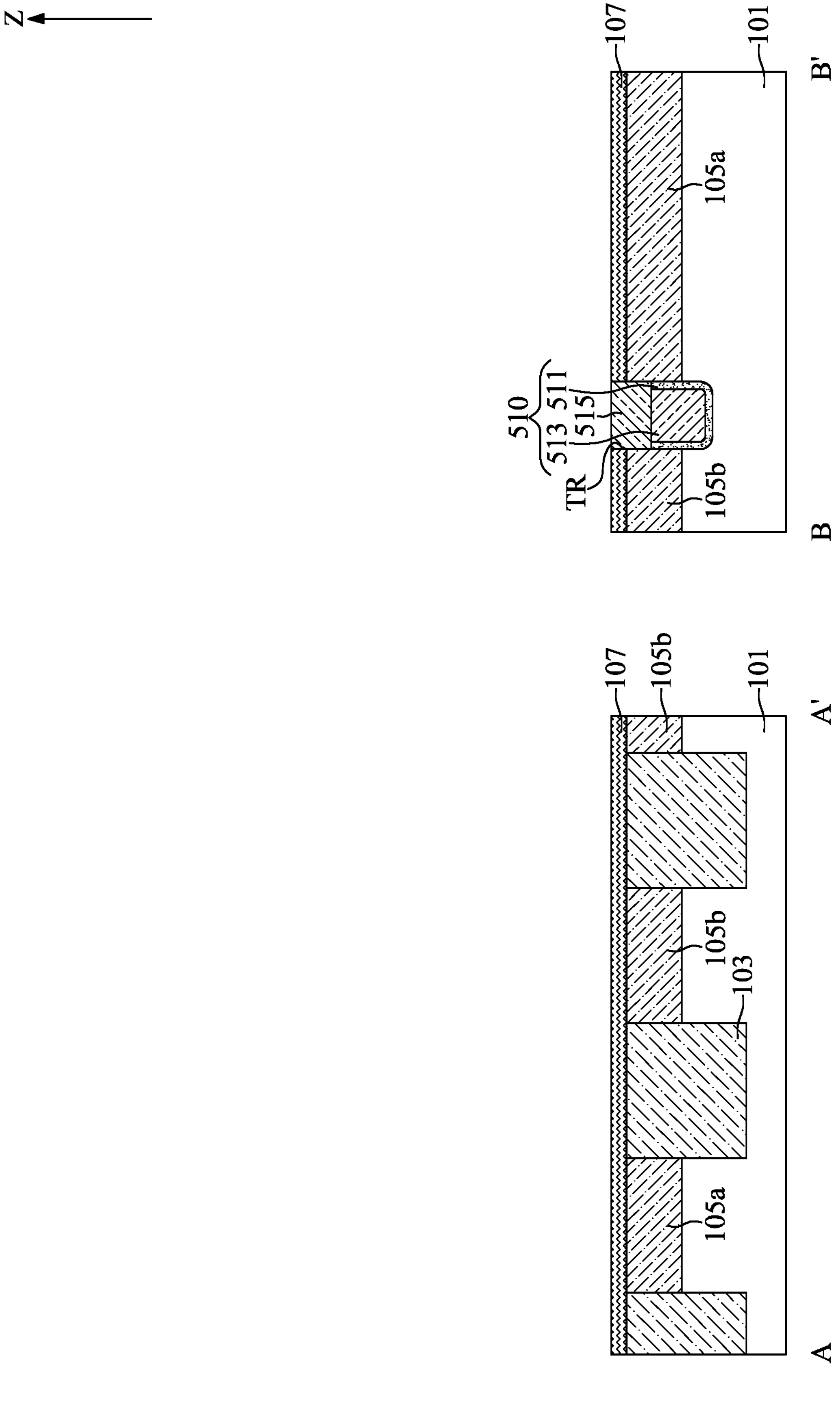
FIG. 3 is a schematic cross-sectional view diagram taken along lines A-A' and B-B' in FIG. 2.
Figure 4:
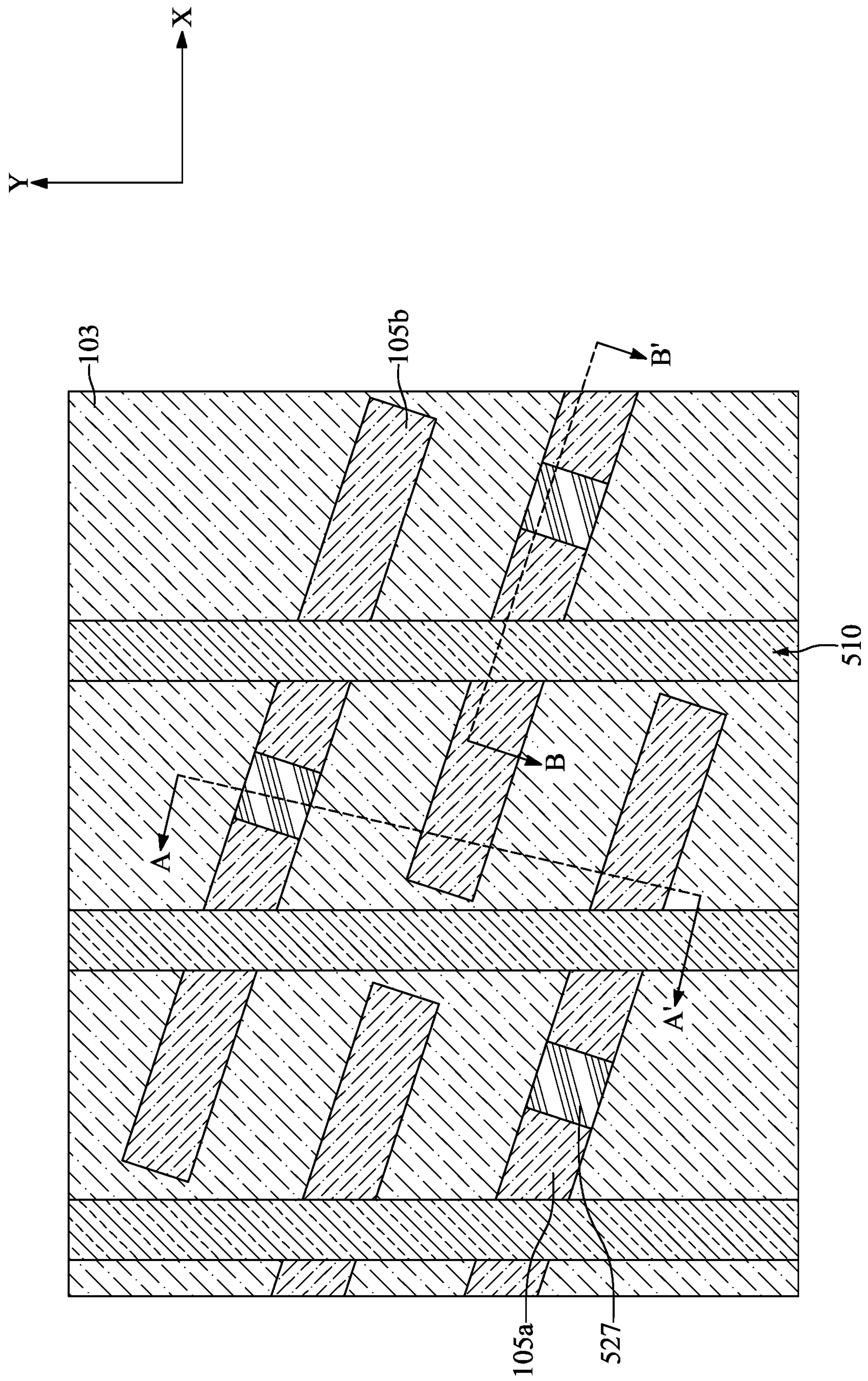
FIG. 4 illustrates, in a schematic top-view diagram, an intermediate semiconductor device in accordance with one embodiment of the present disclosure.
Figure 5:
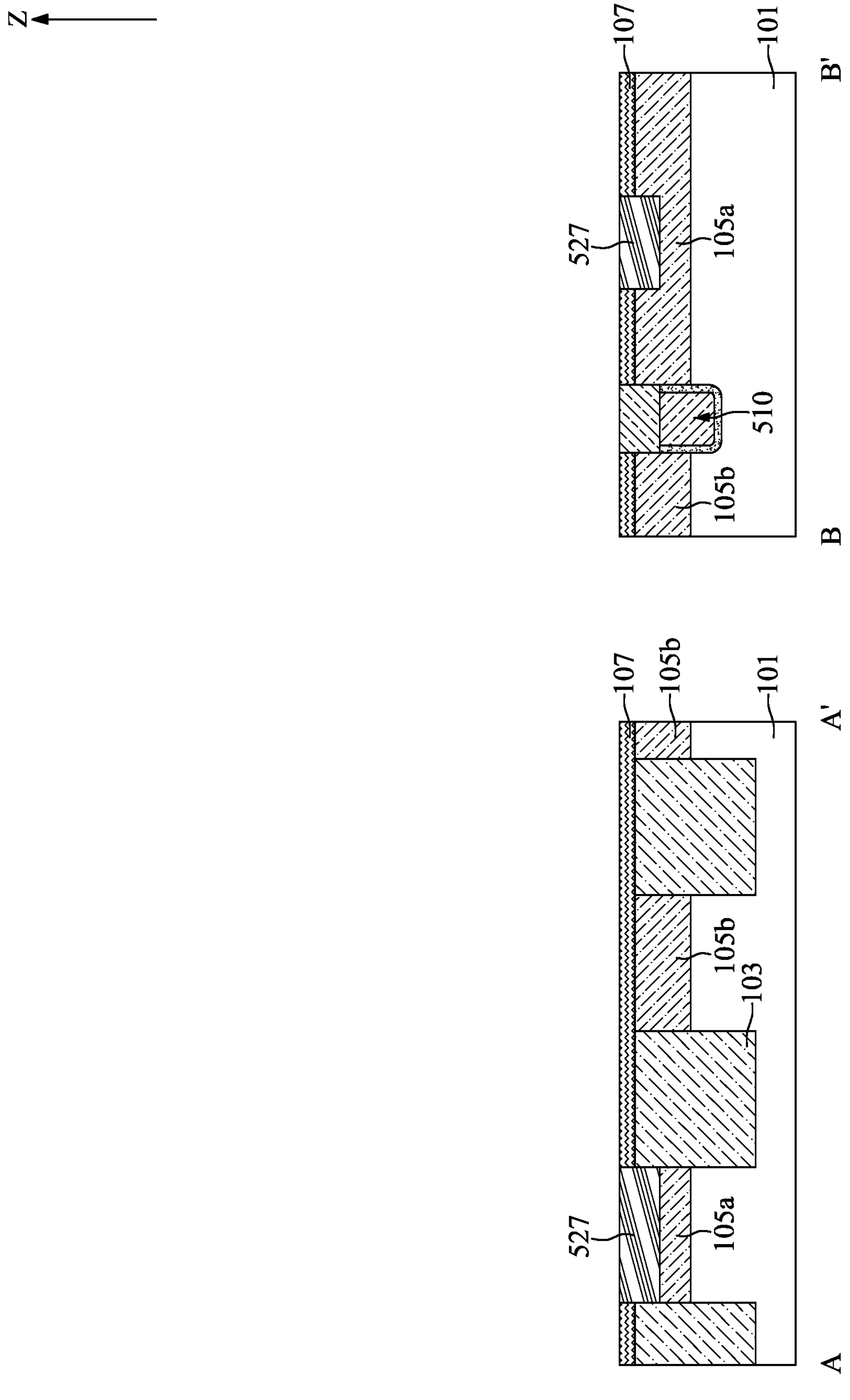
FIG. 5 is a schematic cross-sectional view diagram taken along lines A-A' and B-B' in FIG. 4.
Figure 6:
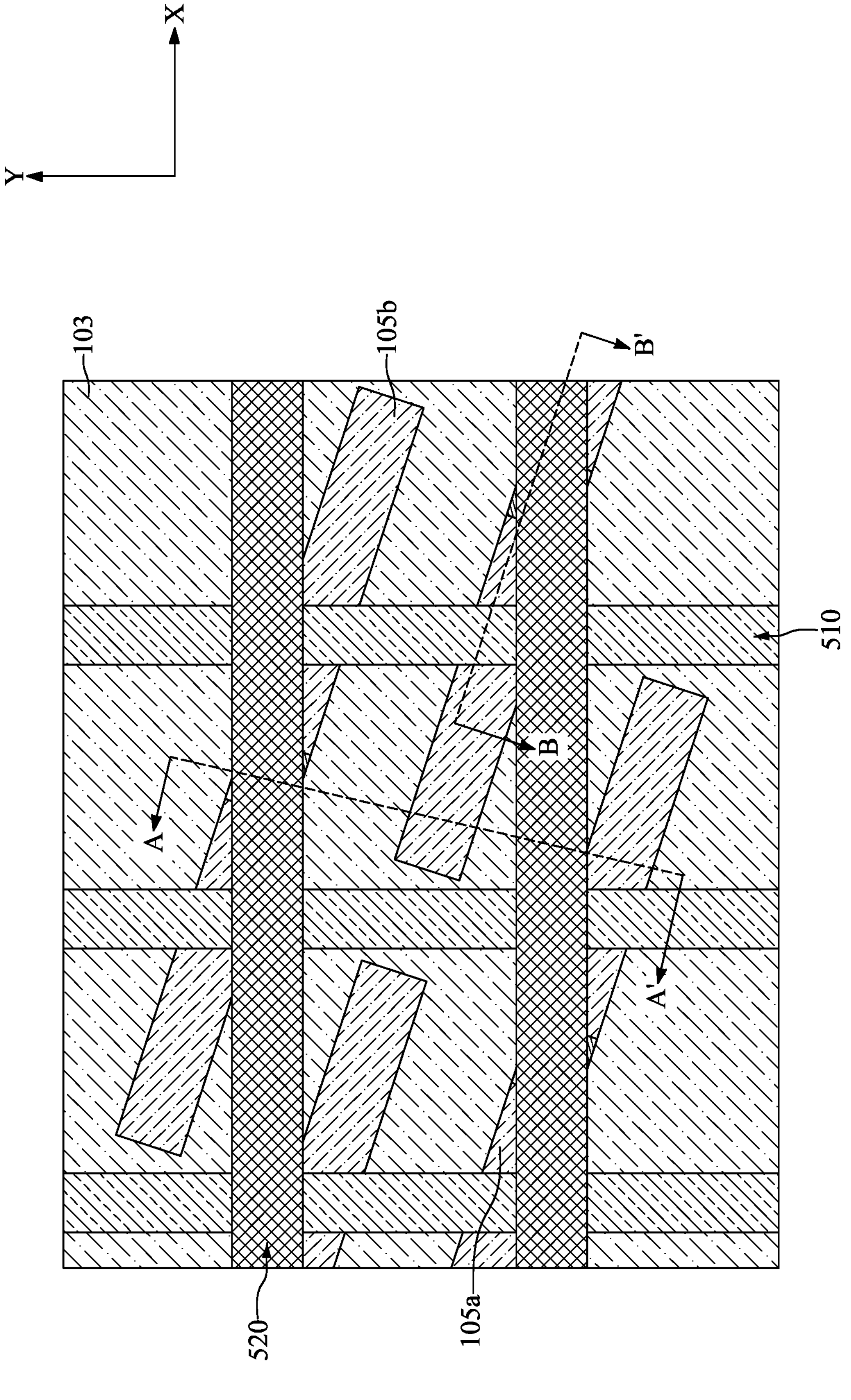
FIG. 6 illustrates, in a schematic top-view diagram, an intermediate semiconductor device in accordance with one embodiment of the present disclosure.
Figure 7:
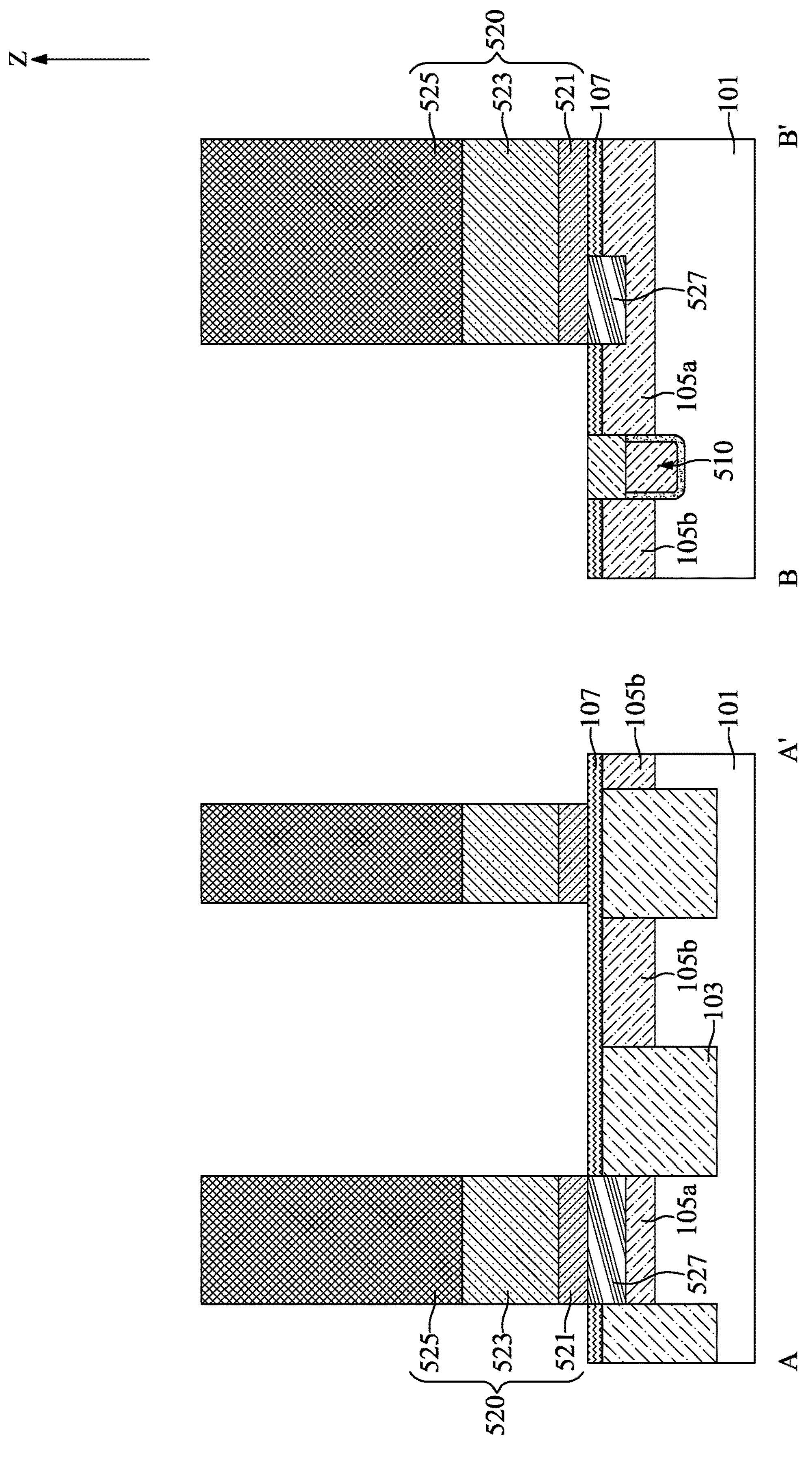
FIG. 7 is a schematic cross-sectional view diagram taken along lines A-A' and B-B' in FIG. 6.

FIG. 1 illustrates, in a flowchart diagram form, a method 10 for fabricating a semiconductor device 1A in accordance with one embodiment of the present disclosure. FIG. 2 illustrates, in a schematic top-view diagram, an intermediate semiconductor device in accordance with one embodiment of the present disclosure. FIG. 3 is a schematic cross-sectional view diagram taken along lines A-A' and B-B' in FIG. 2. FIG. 4 illustrates, in a schematic top-view diagram, an intermediate semiconductor device in accordance with one embodiment of the present disclosure. FIG. 5 is a schematic cross-sectional view diagram taken along lines A-A' and B-B' in FIG. 4. FIG. 6 illustrates, in a schematic top-view diagram, an intermediate semiconductor device in accordance with one embodiment of the present disclosure. FIG. 7 is a schematic cross-sectional view diagram taken along lines A-A' and B-B' in FIG. 6.

With reference to FIGS. 1 to 7, at step S11, a substrate 101 may be provided, a plurality of common source regions 105*a* and a plurality of drain regions 105*b* may be formed in the substrate 101, a plurality of word line structures 510 may be formed in the substrate 101, and a plurality of bit line structures 520 may be formed on the substrate 101.

With reference to FIGS. 2 and 3, the substrate 101 may include a bulk semiconductor substrate. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 101 may include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and about 200 nm. The insulator layer may eliminate leakage current between adjacent elements in the substrate 101 and reduce parasitic capacitance associated with source/drains.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIGS. 2 and 3, the isolation layer 103 may be formed in the substrate 101. A series of deposition processes may be performed to deposit a pad oxide layer (not shown) and a pad nitride layer (not shown) on the substrate 101. A photolithography process and a subsequent etching process, such as an anisotropic dry etching process, may be performed to form trenches penetrating through the pad oxide layer, the pad nitride layer, and extending to the substrate 101. An insulating material may be deposited into the trenches and a planarization process, such as chemical mechanical polishing, may be subsequently performed until the top surface of the substrate 101 is exposed to remove excess filling material, provide a substantially flat surface for subsequent processing steps, and concurrently form the isolation layer 103. The insulating material may be, for example, silicon oxide or other applicable insulating materials. The isolation layer 103 may define the plurality of active areas (not annotated) in the substrate 101.

It should be noted that, in the description of the present disclosure, a surface of an element (or a feature) located at the highest vertical level along the Z axis is referred to as a top surface of the element (or the feature). A surface of an element (or a feature) located at the lowest vertical level along the Z axis is referred to as a bottom surface of the element (or the feature).

With reference to FIGS. 2 and 3, a plurality of impurity regions (not annotated) may be formed in the plurality of active areas, respectively and correspondingly. In some embodiments, the plurality of impurity regions may be formed by an implantation process. That is, the plurality of impurity regions may be turned from portions of the plurality of active areas. The dopants of the implantation process may include p-type impurities (dopants) or n-type impurities (dopants). The p-type impurities may be added to an intrinsic semiconductor to create deficiencies of valence electrons. In a silicon-containing substrate, examples of p-type dopants, i.e., impurities include but are not limited to boron, aluminum, gallium, and indium. The n-type impurities may be added to an intrinsic semiconductor to contribute free electrons to the intrinsic semiconductor. In a silicon-containing substrate, examples of n-type dopants, i.e., impurities, include but are not limited to antimony, arsenic, and phosphorus. In some embodiments, the dopant concentration of the plurality of impurity regions 105 may be between about 1E19 atoms/cm$^\wedge_3$ and about 1E21 atoms/cm^3. After the implantation process, the plurality of impurity regions 105 may have an electrical type such as n-type or p-type.

With reference to FIGS. 2 and 3, a plurality of word line trenches TR may be formed in the substrate 101 to define the position of the plurality of word line structures 510. The plurality of word line trenches TR may be formed by a photolithography process and a following etching process. In some embodiments, the plurality of word line trenches TR may have a line-shaped cross-sectional profile and extend along the direction Y and traversing (or intersecting) the plurality of impurity regions in a top-view perspective. For example, each impurity region may be intersected with two word line trenches TR. The plurality of word line trenches TR may divide the plurality of impurity regions into a plurality of common source regions 105*a* and a plurality of drain regions 105*b*. For one impurity region, one common source region 105*a* may be formed between the two word line trenches TR and two drain regions 105*b* may be formed respectively and correspondingly between the isolation layer 103 and the two word line trenches TR.

With reference to FIGS. 2 and 3, the plurality of word line structures 510 (e.g., two word line structures 510) may be formed in the plurality of word line trenches TR (e.g., two word line trenches TR), respectively and correspondingly. For brevity, clarity, and convenience of description, only one word line structure 510 is described. The word line structure 510 may include a word line dielectric layer 511, a word line conductive layer 513, and a word line capping layer 515.

With reference to FIGS. 2 and 3, the word line dielectric layer 511 may be conformally formed on the inner surface of the word line trench TR. The word line dielectric layer 511 may have a U-shaped cross-sectional profile. In other words, the word line dielectric layer 511 may be inwardly formed in the active area. In some embodiments, the word line dielectric layer 511 may be formed by a thermal oxidation process. For example, the word line dielectric layer 511 may be formed by oxidizing the inner surface of the word line trench TR. In some embodiments, the word line dielectric layer 511 may be formed by a deposition process such as a chemical vapor deposition or an atomic layer deposition. The word line dielectric layer 511 may include a high-k material, an oxide, a nitride, an oxynitride or combinations thereof. In some embodiments, after a liner polysilicon layer (not shown for clarity) is deposited, the word line dielectric layer 511 may be formed by radical-oxidizing the liner polysilicon layer. In some embodiments, after a liner silicon nitride layer (not shown for clarity) is formed, the word line dielectric layer 511 may be formed by radical-oxidizing the liner silicon nitride layer.

In some embodiments, the high-k material may include a hafnium-containing material. The hafnium-containing material may be, for example, hafnium oxide, hafnium silicon oxide, hafnium silicon oxynitride, or a combination thereof. In some embodiments, the high-k material may be, for example, lanthanum oxide, lanthanum aluminum oxide, zirconium oxide, zirconium silicon oxide, zirconium silicon oxynitride, aluminum oxide or a combination thereof.

With reference to FIGS. 2 and 3, the word line conductive layer 513 may be formed on the word line dielectric layer 511 and within the word line trench TR. In some embodiments, in order to form the word line conductive layer 513, a conductive layer (not shown for clarity) may be formed to fill the word line trench TR, and a recessing process may be subsequently performed. The recessing process may be performed as an etching back process or sequentially performed as the planarization process and an etching back process. The word line conductive layer 513 may have a recessed shape that partially fills the word line trench TR. That is, the top surface of the word line conductive layer 513 may be lower than the top surface of the substrate 101.

In some embodiments, the word line conductive layer 513 may include a metal, a metal nitride, or a combination thereof. For example, the word line conductive layer 513 may be formed of titanium nitride, tungsten, or a titanium nitride/tungsten. After the titanium nitride is conformally formed, the titanium nitride/tungsten may have a structure where the word line trench TR is partially filled using tungsten. The titanium nitride or the tungsten may be solely used for the word line conductive layer 513. In some embodiments, the word line conductive layer 513 may be formed of, for example, a conductive material such as doped polycrystalline silicon, doped polycrystalline silicon germanium, or a combination thereof. In some embodiments, the word line conductive layer 513 may be formed of, for example, tungsten, aluminum, titanium, copper, the like, or a combination thereof.

With reference to FIGS. 2 and 3, a dielectric material (not shown) may be deposited by, for example chemical vapor deposition, to completely fill the word line trenches TR and covering the top surface of the substrate 101. A planarization process, such as chemical mechanical polishing, may be performed to provide a substantially flat surface for subsequent processing steps and form the word line capping layer 515. In some embodiments, the word line capping layer 515 may be formed of, for example, silicon nitride, or other applicable dielectric material.

With reference to FIGS. 4 and 5, a bottom insulating layer 107 (not shown in the top-view diagram for clarity) may be formed on the substrate 101. In some embodiments, the bottom insulating layer 107 may be formed of a material having etching selectivity to the substrate 101 and the isolation layer 103. In some embodiments, the bottom insulating layer 107 may be formed of, for example, silicon nitride, boron nitride, silicon boron nitride, phosphorus boron nitride, boron carbon silicon nitride, or a combination thereof. In some embodiments, the bottom insulating layer 107 may be formed of, for example, silicon nitride. In some embodiments, the bottom insulating layer 107 may be formed by, for example, chemical vapor deposition, plasma-enhanced chemical vapor deposition, or other applicable deposition processes.

With reference to FIGS. 4 and 5, a plurality of bit line contacts 527 may be formed penetrating the bottom insulating layer 107 and extending to the plurality of common source regions 105*a*, respectively and correspondingly. In some embodiments, the plurality of bit line contacts 527 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the plurality of bit line contacts 527 may have a square-shaped cross-sectional profile in a top-view perspective but is not limited to that shape. In some embodiments, the plurality of bit line contacts 527 may have a rectangle-shaped, a circle-shaped, or other applicable shaped cross-sectional profile in a top-view perspective.

With reference to FIGS. 6 and 7, the plurality of bit line structures 520 may be formed on the bottom insulating layer 107 and electrically connected to the plurality of bit line contacts 527, respectively and correspondingly. In a top-view perspective, the plurality of bit line structures 520 may extend along the direction X and be separated from each other. In other words, the plurality of bit line structures 520 may intersect with the plurality of word line structures 510 in a top-view perspective. For brevity, clarity, and convenience of description, only one bit line structure 520 is described. In some embodiments, the bit line structure 520 may include a bit line bottom conductive layer 521, a bit line top conductive layer 523, and a bit line capping layer 525.

The bit line bottom conductive layer 521 may be formed on the bit line contact 527. In some embodiments, the bit line bottom conductive layer 521 may be formed of, for example, doped polycrystalline silicon, doped polycrystalline germanium, doped polycrystalline silicon germanium, or a combination thereof. In some embodiments, the dopants for the bit line bottom conductive layer 521 may include boron, aluminum, gallium, indium, antimony, arsenic, or phosphorus.

The bit line top conductive layer 523 may be formed on the bit line bottom conductive layer 521. In some embodiments, the bit line top conductive layer 523 may be formed of, for example, titanium, nickel, platinum, tantalum, cobalt, silver, copper, aluminum, other applicable conductive material, or a combination thereof.

The bit line capping layer 525 may be formed on the bit line top conductive layer 523. In some embodiments, the bit line capping layer 525 may be formed of, for example, silicon nitride or other applicable insulating material.

Figure 8:
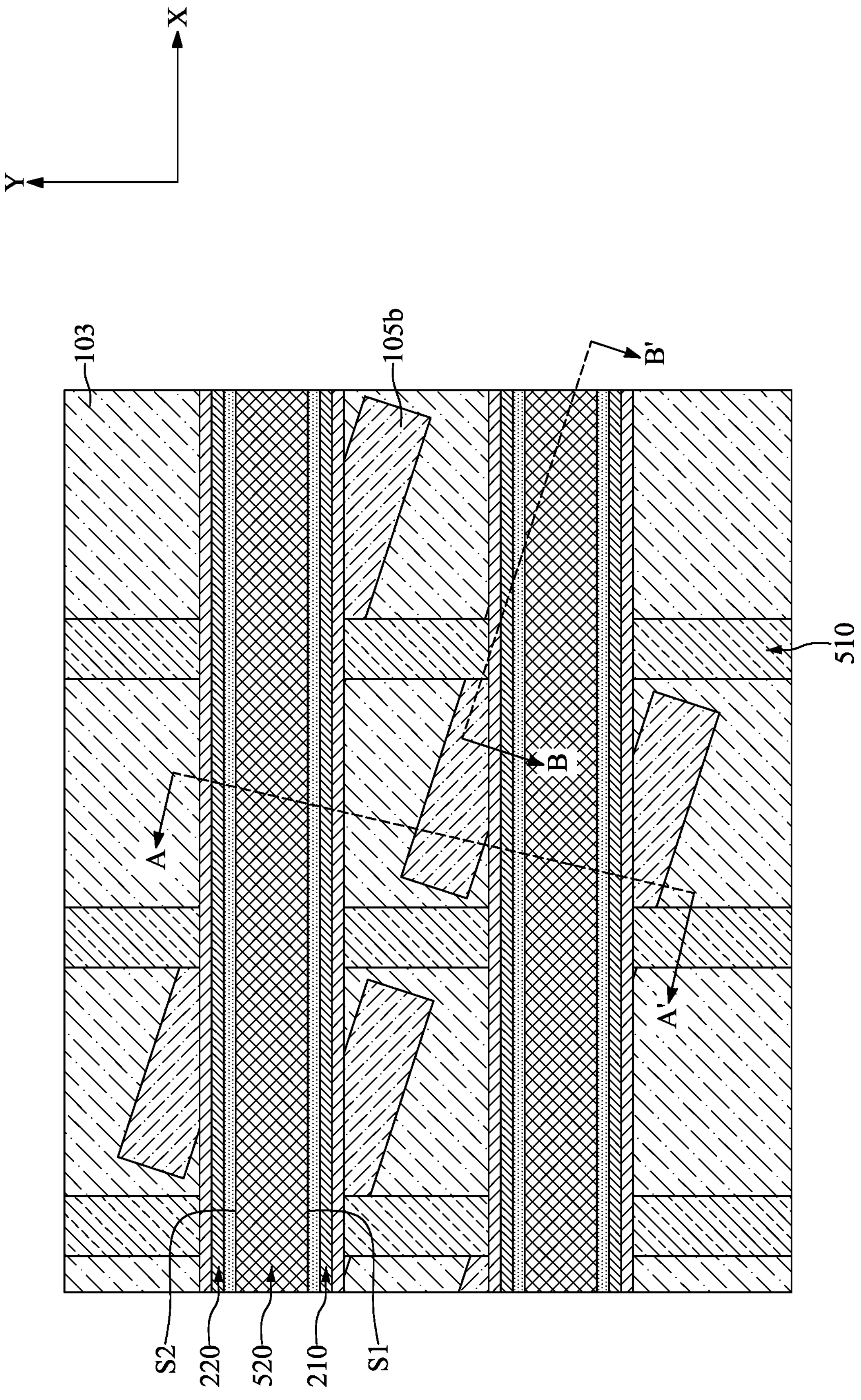
FIG. 8 illustrates, in a schematic top-view diagram, an intermediate semiconductor device in accordance with one embodiment of the present disclosure.
Figure 9:
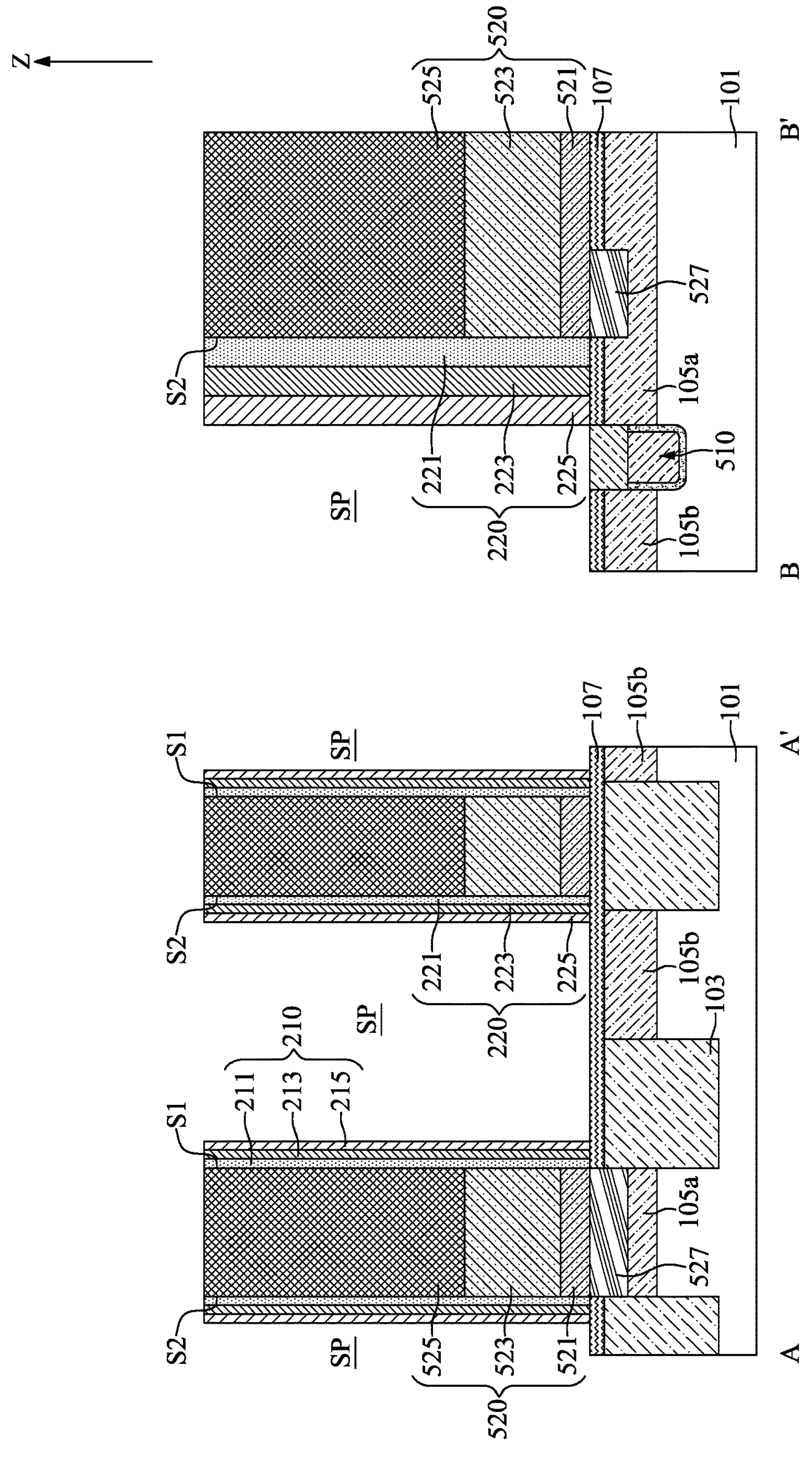
FIGS. 9 and 10 are schematic cross-sectional view diagrams taken along lines A-A' and B-B' in FIG. 8 illustrating part of a flow for fabricating the semiconductor device in accordance with one embodiment of the present disclosure.
Figure 10:
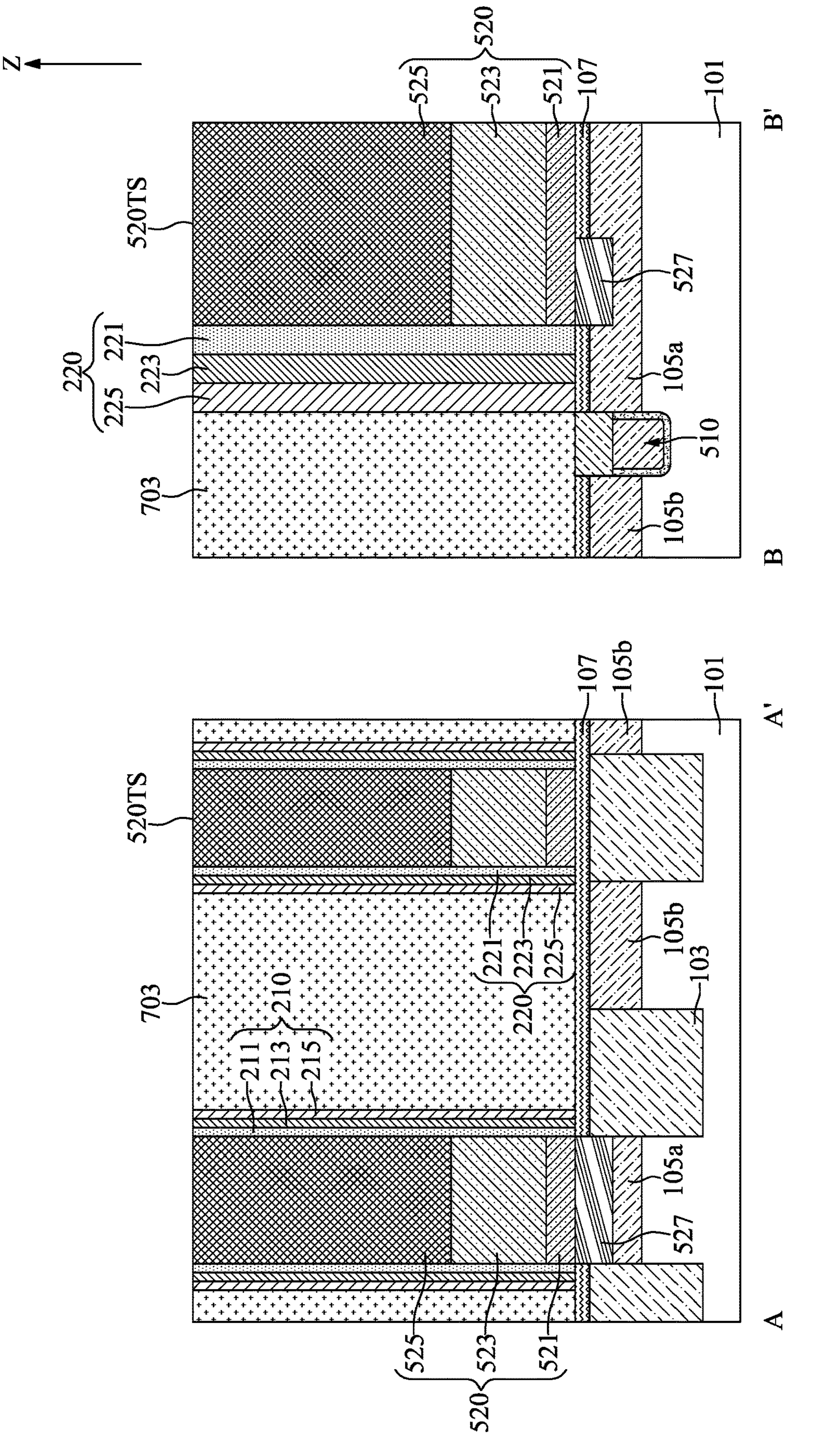

FIG. 8 illustrates, in a schematic top-view diagram, an intermediate semiconductor device in accordance with one embodiment of the present disclosure. FIGS. 9 and 10 are schematic cross-sectional view diagrams taken along lines A-A' and B-B' in FIG. 8 illustrating part of a flow for fabricating the semiconductor device 1A in accordance with one embodiment of the present disclosure. It should be noted that some elements (e.g., the bottom insulating layer 107) are omitted in top-view diagrams for clarity.

With reference to FIG. 1 and FIGS. 8 to 10, at step S13, a plurality of first spacer structures 210 and a plurality of second spacer structures 220 may be formed on first sides S1 and second sides S2 of the plurality of bit line structures 520, and a sacrificial layer 703 may be formed on the substrate 101 and adjacent to the plurality of first spacer structures 210 and the plurality of second spacer structures 220.

With reference to FIGS. 8 and 9, the plurality of first spacer structures 210 may be formed on the first sides S1 of the plurality of bit line structures 520. In other words, the plurality of first spacer structures 210 may extend along the direction X in a top-view perspective. For brevity, clarity, and convenience of description, only one first spacer structure 210 is described. In some embodiments, the first spacer structure 210 may include a first inner spacer 211, a first middle spacer 213, and a first outer spacer 215.

The first inner spacer 211 may be formed on the first side S1 of the bit line structure 520. In some embodiments, the first inner spacer 211 may be formed of the same material as the bit line capping layer 525. In some embodiments, the first inner spacer 211 may be formed of, for example, silicon nitride or other applicable insulating material. In some embodiments, the first inner spacer 211 may be formed by conformally depositing a layer of insulating material (not shown) over the bottom insulating layer 107 and a subsequent anisotropic etching process.

The first middle spacer 213 may be conformally formed on the first inner spacer 211. In some embodiments, the first middle spacer 213 may be formed of, for example, silicon oxide or other applicable insulating oxides. In some embodiments, the first middle spacer 213 may be formed by conformally depositing a layer of insulating oxide (not shown) over the bottom insulating layer 107 and a subsequent anisotropic etching process.

The first outer spacer 215 may be conformally formed on the first middle spacer 213. In some embodiments, the first outer spacer 215 may be formed of the same material as the first inner spacer 211 or the bit line capping layer 525. In some embodiments, the first outer spacer 215 may be formed of, for example, silicon nitride or other applicable insulating material. In some embodiments, the first outer spacer 215 may be formed by conformally depositing a layer of insulating material (not shown) over the bottom insulating layer 107 and a subsequent anisotropic etching process.

In some embodiments, the first inner spacer 211 may be optional. That is, the first middle spacer 213 may be directly formed on the first side S1 of the bit line structure 520.

With reference to FIGS. 8 and 9, the plurality of second spacer structures 220 may be formed on the second side S2 of the plurality of bit line structures 520. The second side S2 may be parallel to the first side S1. The second spacer structure 220 may be opposite to the first spacer structure 210 with the bit line structure 520 interposed therebetween. The plurality of second spacer structures 220 may extend along the direction X in a top-view perspective. In some embodiments, each of the plurality of second spacer structures 220 may include a second inner spacer 221, a second middle spacer 223, and a second outer spacer 225.

The second inner spacer 221 may be formed on the second side S2 of the bit line structure 520. The second middle spacer 223 may be conformally formed on the second inner spacer 221. The second outer spacer 225 may be conformally formed on the second middle spacer 223. The second inner spacer 221, the second middle spacer 223, and the second outer spacer 225 may be formed of the same materials as the first inner spacer 211, the first middle spacer 213, and the second middle spacer 223, respectively and correspondingly. In some embodiments, the first spacer structure 210 and the second spacer structure 220 may be concurrently formed and spaces SP may be formed between the first spacer structures 210 and the second spacer structures 220.

With reference to FIG. 10, the sacrificial layer 703 may be formed over the bottom insulating layer 107 to completely fill the spaces SP and cover the bit line structures 520, the first spacer structures 210, and the second spacer structures 220. In some embodiments, the sacrificial layer 703 may be formed of, for example, a material having etching selectivity to the first outer spacer 215, the second outer spacer 225, or the bit line capping layer 525. In some embodiments, the sacrificial layer 703 may be formed of, for example, silicon oxynitride, silicon nitride oxide, or other applicable materials. In some embodiments, the sacrificial layer 703 may be formed by, for example, chemical vapor deposition, plasma-enhanced chemical vapor deposition, or other applicable deposition processes. In some embodiments, a planarization process, such as chemical mechanical polishing, may be performed until the top surfaces 520TS of the plurality of bit line structures 300 are exposed to remove excess material and provide a substantially flat surface for subsequent processing steps.

It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

Figure 11:
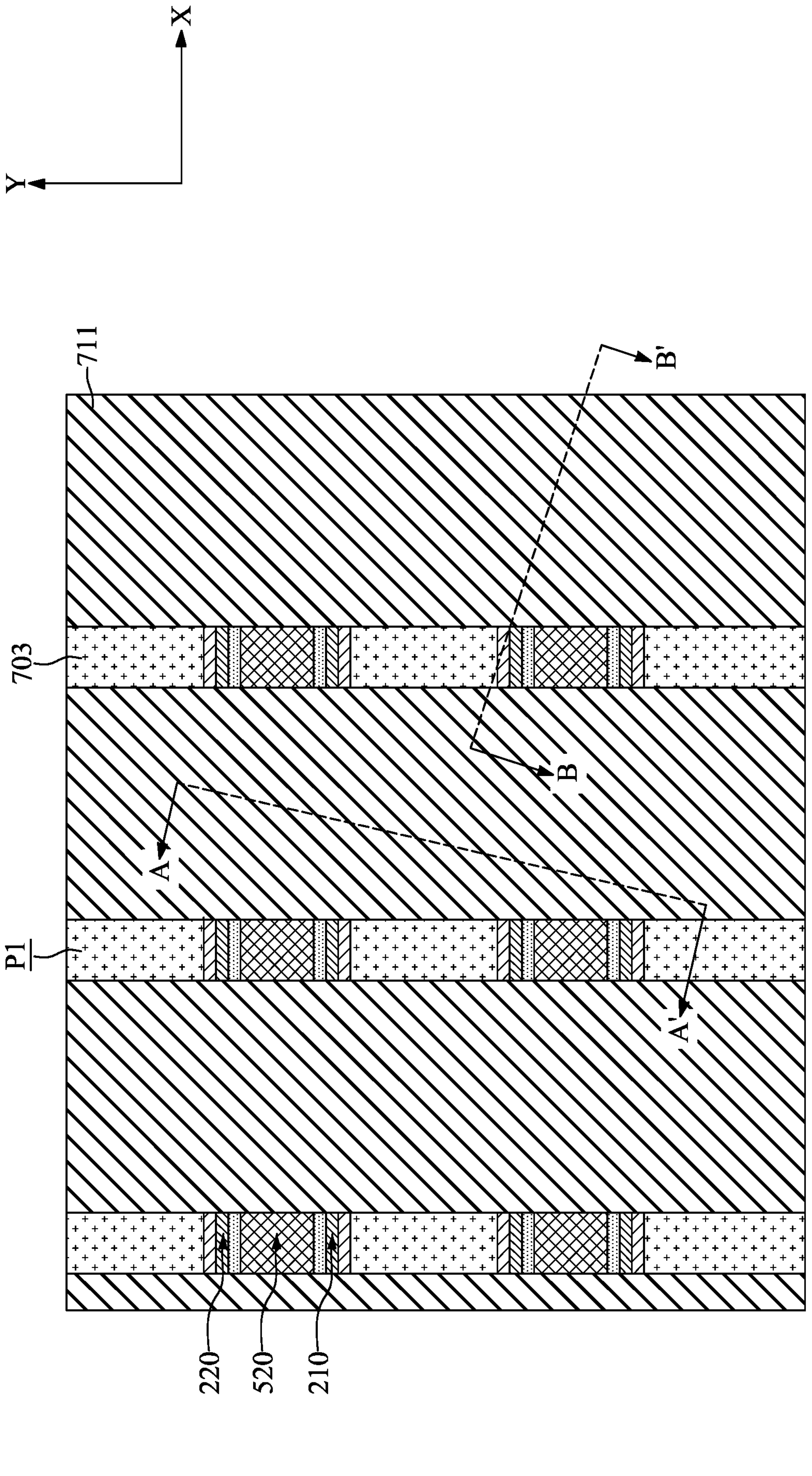
FIG. 11 illustrates, in a schematic top-view diagram, an intermediate semiconductor device in accordance with one embodiment of the present disclosure.
Figure 12:
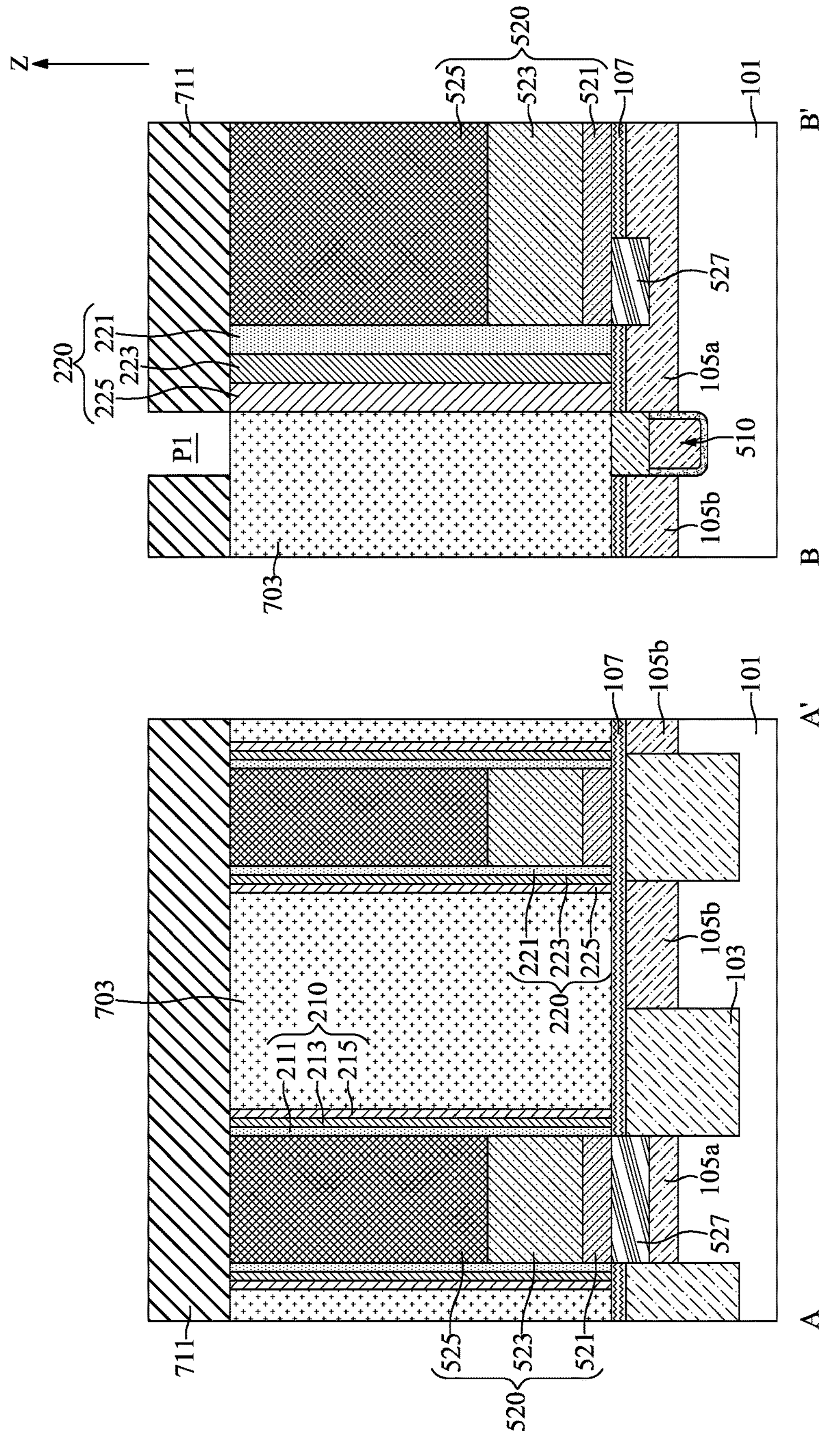
FIGS. 12 and 13 are schematic cross-sectional view diagrams taken along lines A-A' and B-B' in FIG. 11 illustrating part of the flow for fabricating the semiconductor device in accordance with one embodiment of the present disclosure.
Figure 13:
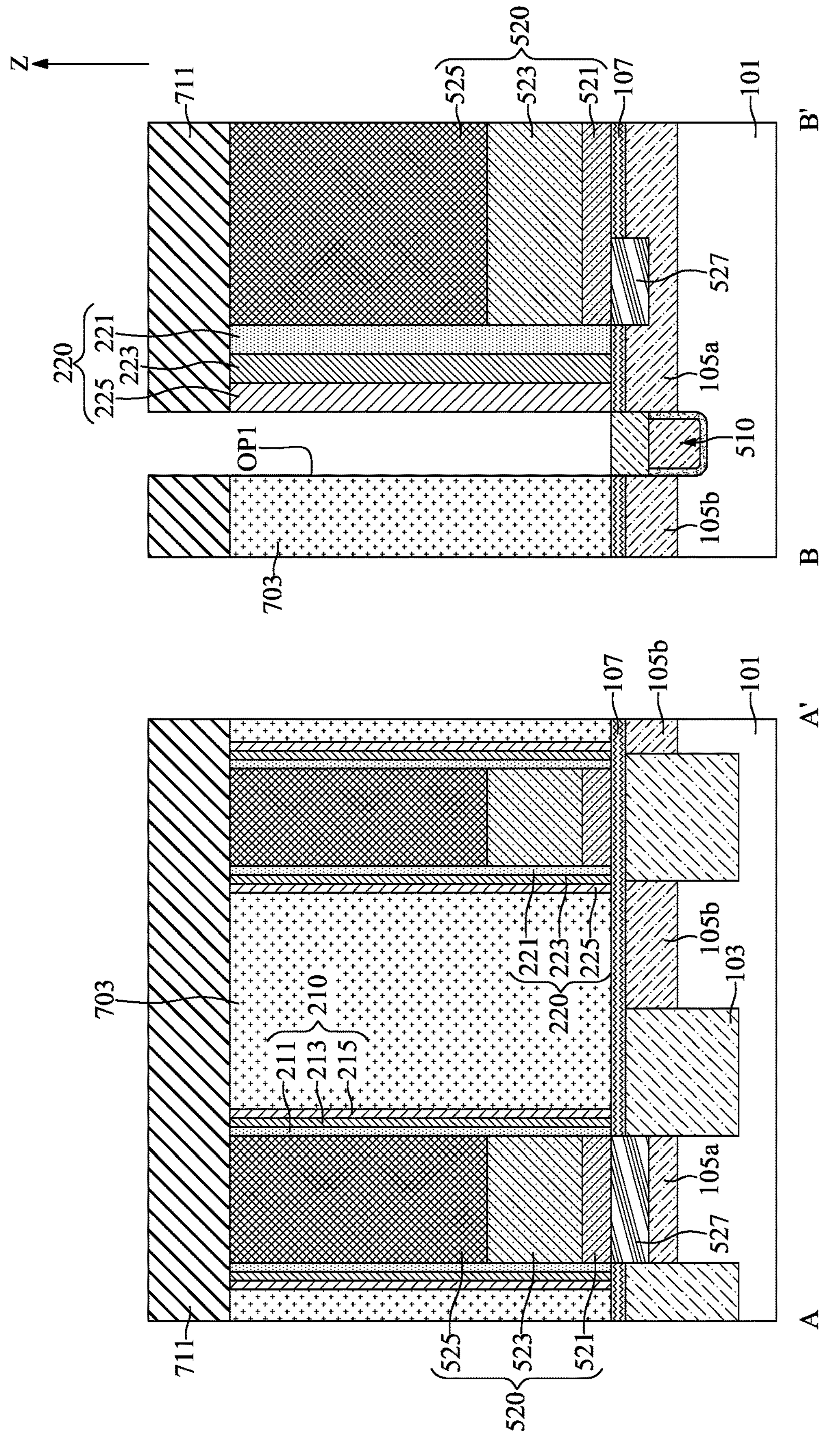
Figure 14:
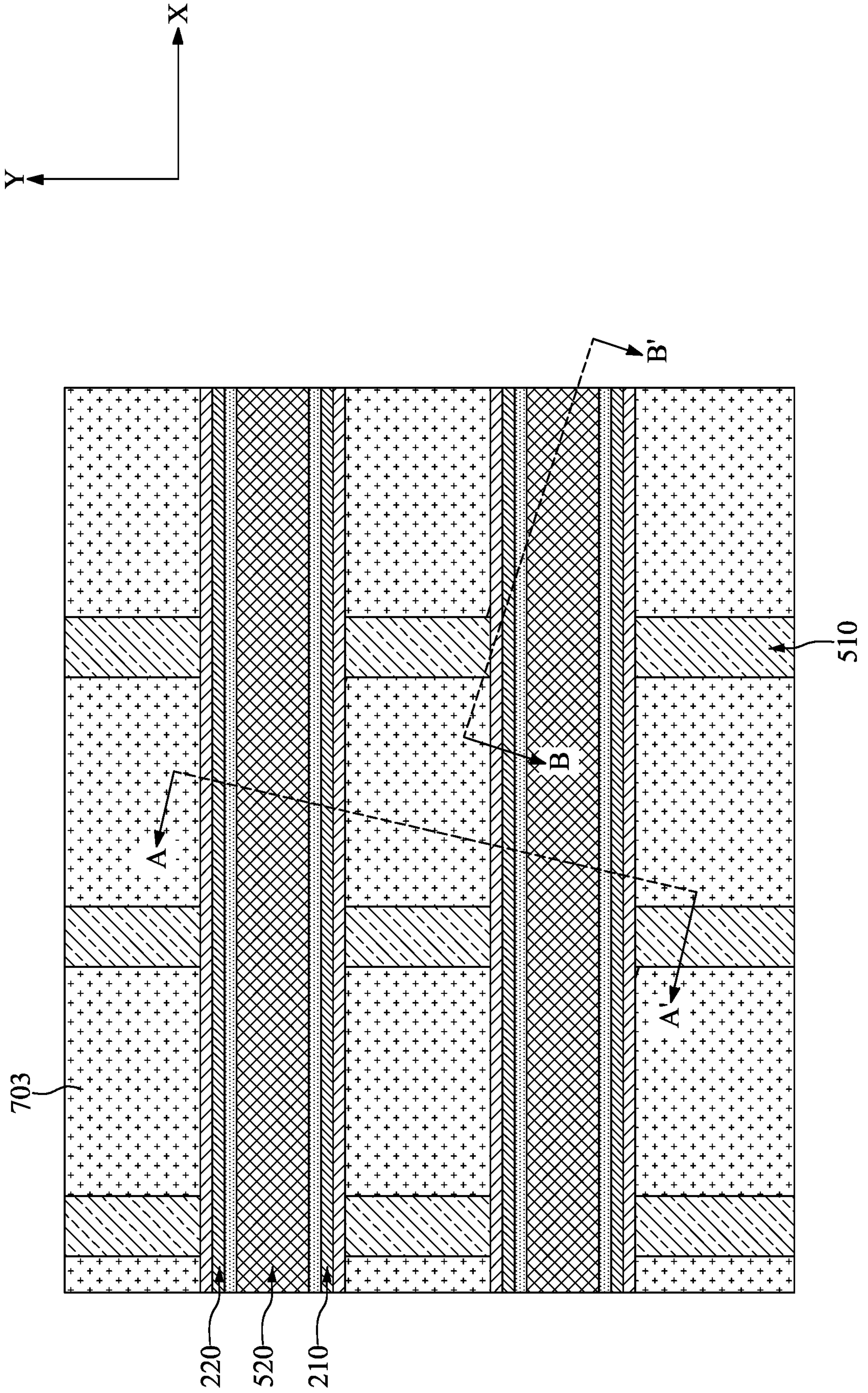
FIG. 14 illustrates, in a schematic top-view diagram, an intermediate semiconductor device in accordance with one embodiment of the present disclosure.
Figure 15:
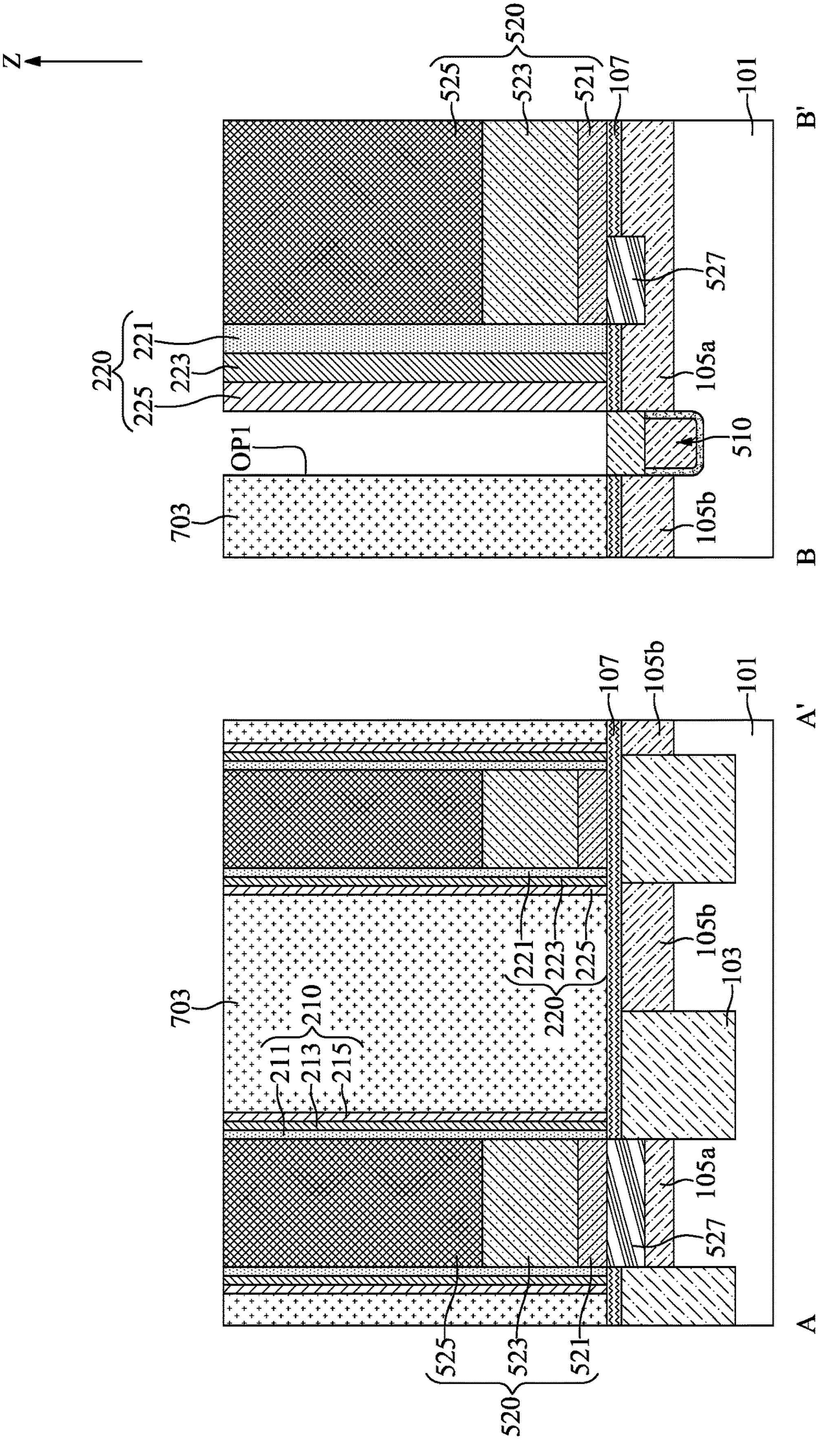
FIGS. 15 and 16 are schematic cross-sectional view diagrams taken along lines A-A' and B-B' in FIG. 14 illustrating part of the flow for fabricating the semiconductor device in accordance with one embodiment of the present disclosure.
Figure 16:
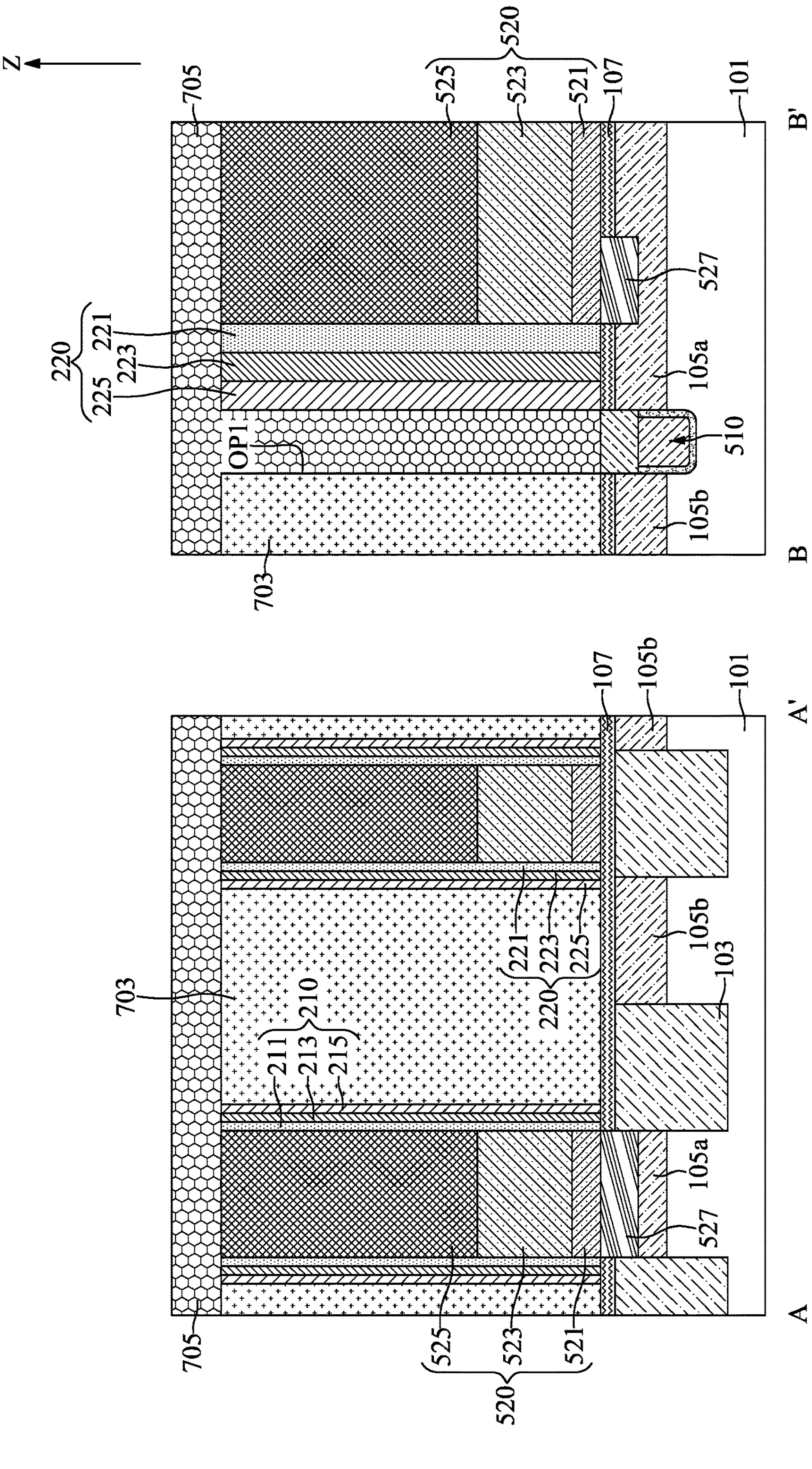
Figure 17:
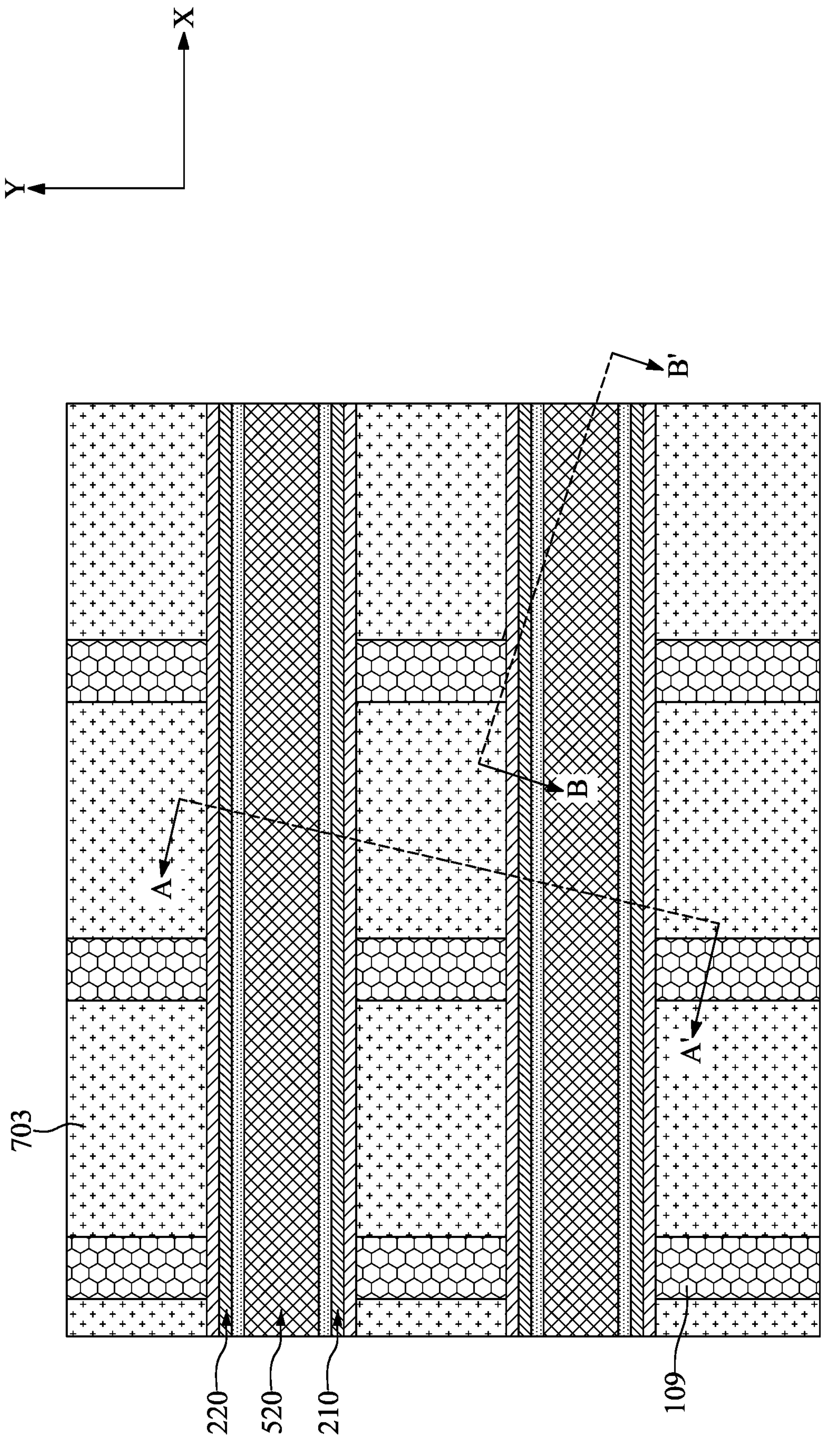
FIG. 17 illustrates, in a schematic top-view diagram, an intermediate semiconductor device in accordance with one embodiment of the present disclosure.
Figure 18:
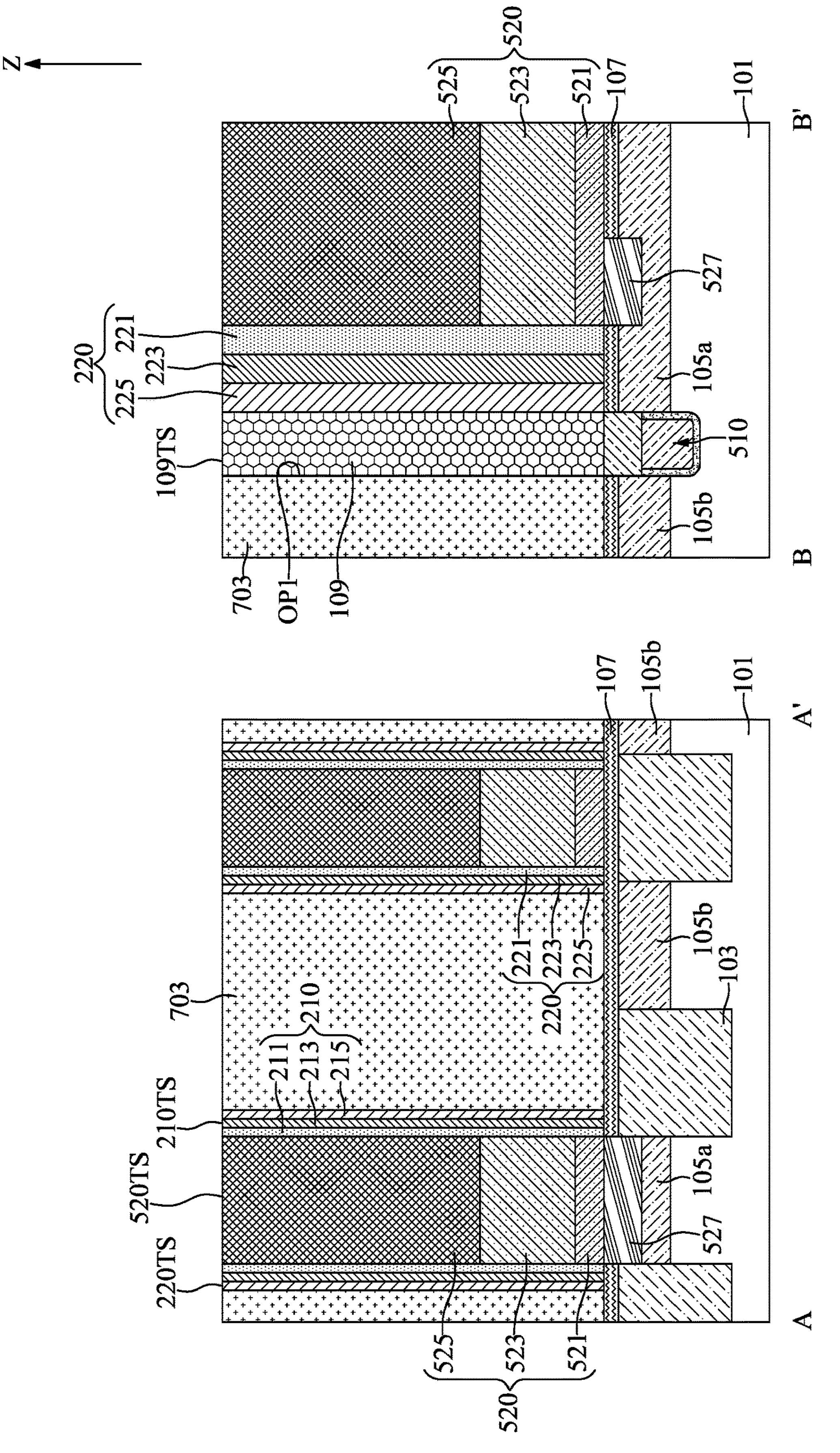
FIG. 18 is a schematic cross-sectional view diagram taken along lines A-A' and B-B' in FIG. 17.

FIG. 11 illustrates, in a schematic top-view diagram, an intermediate semiconductor device in accordance with one embodiment of the present disclosure. FIGS. 12 and 13 are schematic cross-sectional view diagrams taken along lines A-A' and B-B' in FIG. 11 illustrating part of the flow for fabricating the semiconductor device 1A in accordance with one embodiment of the present disclosure. FIG. 14 illustrates, in a schematic top-view diagram, an intermediate semiconductor device in accordance with one embodiment of the present disclosure. FIGS. 15 and 16 are schematic cross-sectional view diagrams taken along lines A-A' and B-B' in FIG. 14 illustrating part of the flow for fabricating the semiconductor device 1A in accordance with one embodiment of the present disclosure. FIG. 17 illustrates, in a schematic top-view diagram, an intermediate semiconductor device in accordance with one embodiment of the present disclosure. FIG. 18 is a schematic cross-sectional view diagram taken along lines A-A' and B-B' in FIG. 17.

With reference to FIG. 1 and FIGS. 11 to 18, at step S15, a first mask layer 711 including a line pattern P1 may be formed on the sacrificial layer 703 to partially expose the sacrificial layer 703, the plurality of bit line structures 520, the plurality of first spacer structures 210, and the plurality of second spacer structures 220, the sacrificial layer 703 may be selectively removed to form a plurality of partition openings OP1, and a plurality of partition layers 109 may be formed in the plurality of partition openings OP1.

With reference to FIGS. 11 and 12, a first mask layer 711 may be formed over the substrate 101. In some embodiments, the first mask layer 711 may be a photoresist layer. In a top-view perspective, the line pattern P1 of the first mask layer 711 may include multiple rectangle-shaped spaces extending along the direction Y and arranged alternatively along the direction X. Through these spaces, the sacrificial layer 703, the bit line structure 520, the first spacer structure 210, and the second spacer structure 220 may be partially exposed.

With reference to FIG. 13, the sacrificial layer 703 that is exposed through the line pattern P1 of the first mask layer 711 may be selectively removed. In some embodiments, the removal of the sacrificial layer 703 may be achieved by an anisotropic etching process such as an anisotropic dry etching process. After the removal of the sacrificial layer 703, the plurality of partition openings OP1 may be formed in the locations where the sacrificial layer 703 was exposed through the line pattern P1 of the first mask layer 711.

With reference to FIGS. 14 and 15, the first mask layer 711 may then be removed subsequent to the formation of these partition openings OP1.

With reference to FIG. 16, a layer of partition material 705 may be formed over the sacrificial layer 703 to completely fill the plurality of partition openings OP1. In some embodiments, the partition material 705 may be a material having etching selectivity to the sacrificial layer 703. In some embodiments, the partition material 705 may be the same material as the bit line capping layer 525 or the first outer spacer 215 (or the second outer spacer 225). In some embodiments, the partition material 705 may be, for example, silicon nitride or other applicable insulating material. In some embodiments, the layer of partition material 705 may be formed of, for example, chemical vapor deposition or other applicable deposition processes.

With reference to FIGS. 17 and 18, a planarization process, such as chemical mechanical polishing, may be performed to remove excess material, provide a substantially flat surface for subsequent processing steps, and turn the layer of partition material 705 into a plurality of partition layers 109. In a top-view perspective, each of the plurality of partition layers 109 may have a line-shaped (or rectangle-shaped or square-shaped) cross-sectional profile extending along the direction Y. The plurality of partition layers 109 may be arranged alternatively along the direction Y, with each corresponding bit line structure 520 situated between two adjacent partition layers 109. Along the direction X, the plurality of partition layers 109 may be arranged alternatively with the sacrificial layer 703 interposed therebetween. In a top-view perspective, the arrangement of the plurality of partition layers 109 and the plurality of bit line structures 520 may divide the sacrificial layer 703 into multiple segments.

For brevity, clarity, and convenience of description, only one partition layer 109 is described. In some embodiments, after the planarization process, the first spacer structure 210 and the second spacer structure 220 may be exposed. The top surface 109TS of the partition layer 109, the top surface 210TS of the first spacer structure 210, the top surface 220TS of the second spacer structure 220, and the top surface 520TS of the bit line structure 520 may be substantially coplanar.

Figure 19:
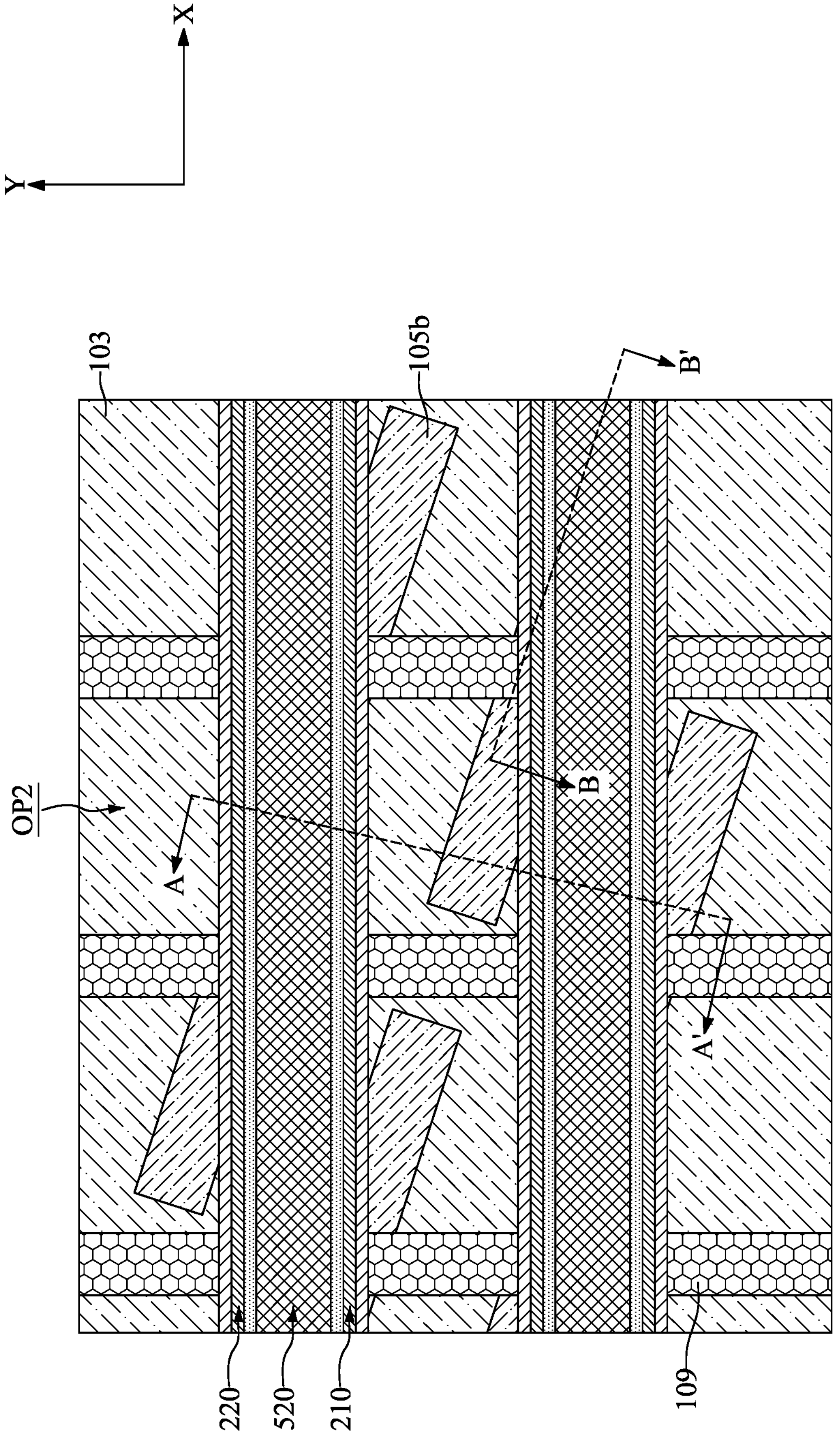
FIG. 19 illustrates, in a schematic top-view diagram, an intermediate semiconductor device in accordance with one embodiment of the present disclosure.
Figure 20:
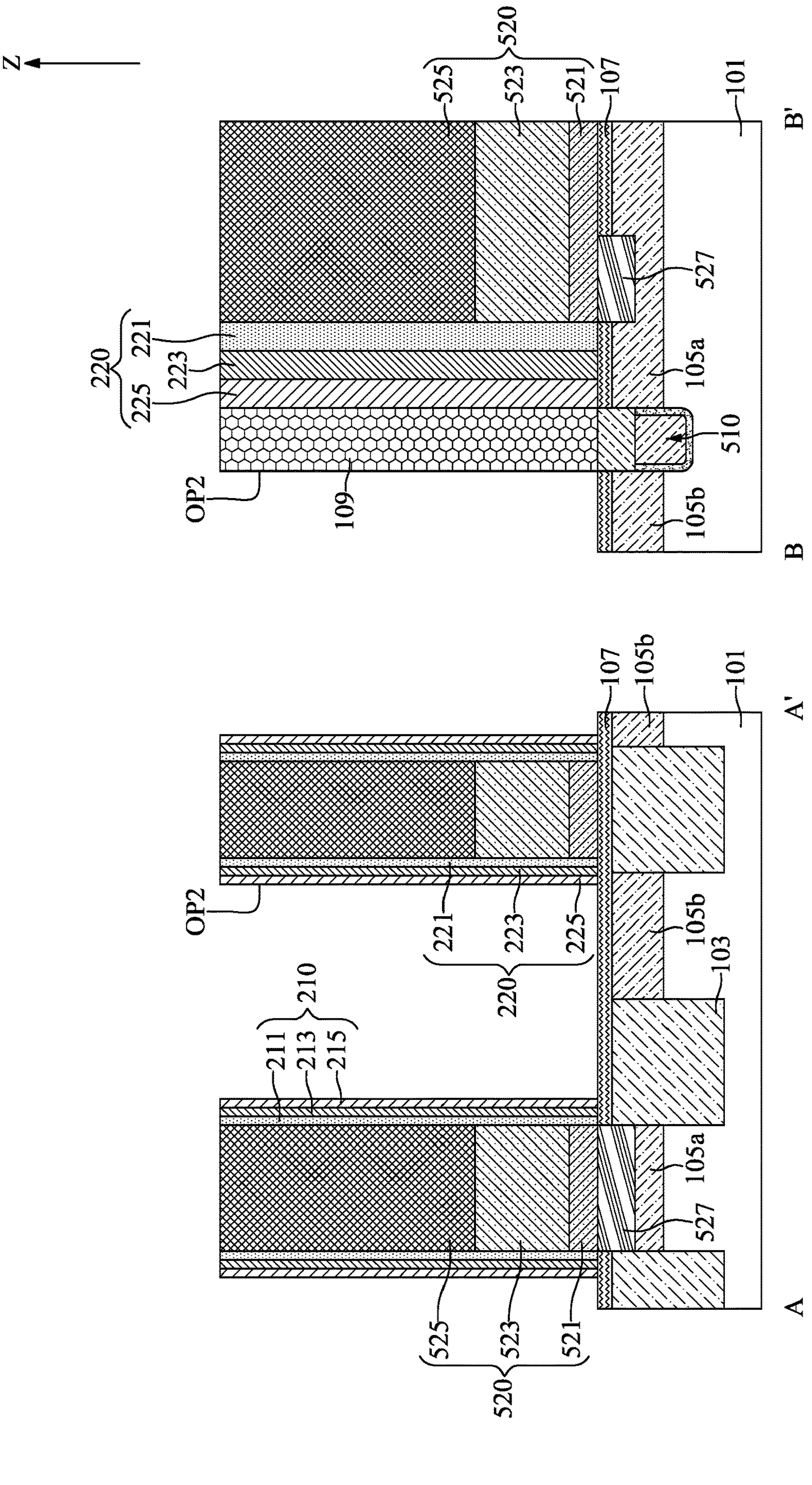
FIG. 20 is a schematic cross-sectional view diagram taken along lines A-A' and B-B' in FIG. 19.
Figure 21:
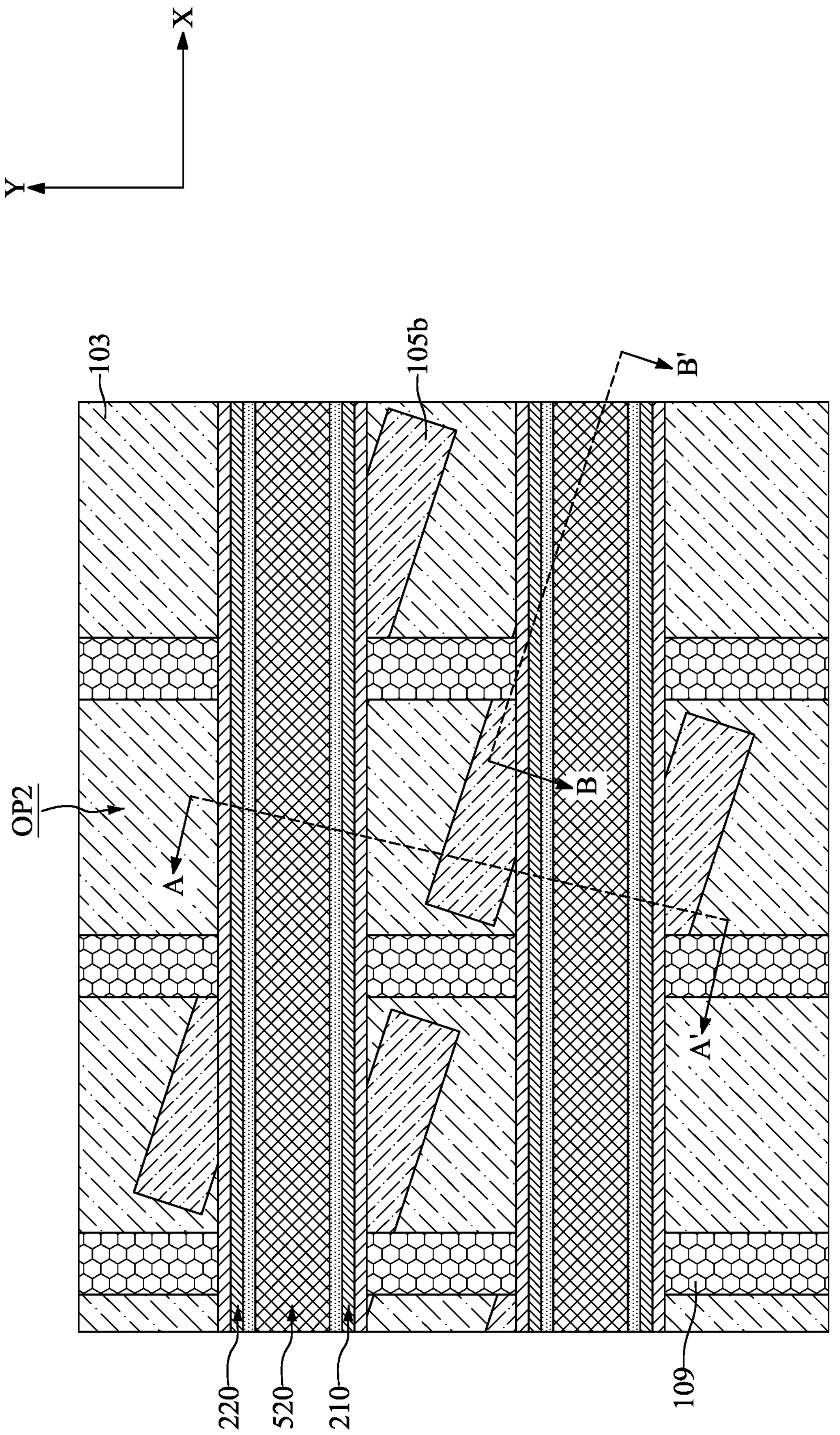
FIG. 21 illustrates, in a schematic top-view diagram, an intermediate semiconductor device in accordance with one embodiment of the present disclosure.

FIG. 19 illustrates, in a schematic top-view diagram, an intermediate semiconductor device in accordance with one embodiment of the present disclosure. FIG. 20 is a schematic cross-sectional view diagram taken along lines A-A' and B-B' in FIG. 19. FIG. 21 illustrates, in a schematic top-view diagram, an intermediate semiconductor device in accordance with one embodiment of the present disclosure. FIGS. 22 to 25 are schematic cross-sectional view diagrams taken along lines A-A' and B-B' in FIG. 21 illustrating part of the flow for fabricating the semiconductor device 1A in accordance with one embodiment of the present disclosure.

With reference to FIG. 1 and FIGS. 19 to 25, at step S17, the sacrificial layer 703 may be selectively removed to form a plurality of cell contact openings OP2, and a plurality of cell contact structures 310 may be formed within the plurality of cell contact openings OP2.

With reference to FIGS. 19 and 20, the sacrificial layer 703 may be selectively removed by an etching process. For example, the removal of the sacrificial layer 703 may be achieved by an anisotropic etching process. After the removal of the sacrificial layer 703, the plurality of cell contact openings OP2 may be formed in the locations where the sacrificial layer 703 (in multiple segments form) was previously occupied. For brevity, clarity, and convenience of description, only one cell contact opening OP2 is described. In a cross-sectional perspective, the cell contact opening OP2 may be disposed on the bottom insulating layer 107. In a top-view perspective, the cell contact opening OP2 may be enclosed by two adjacent partition layers 109 along the direction X and two adjacent first spacer structure 210 and second spacer structure 220 along the direction Y.

Figure 22:
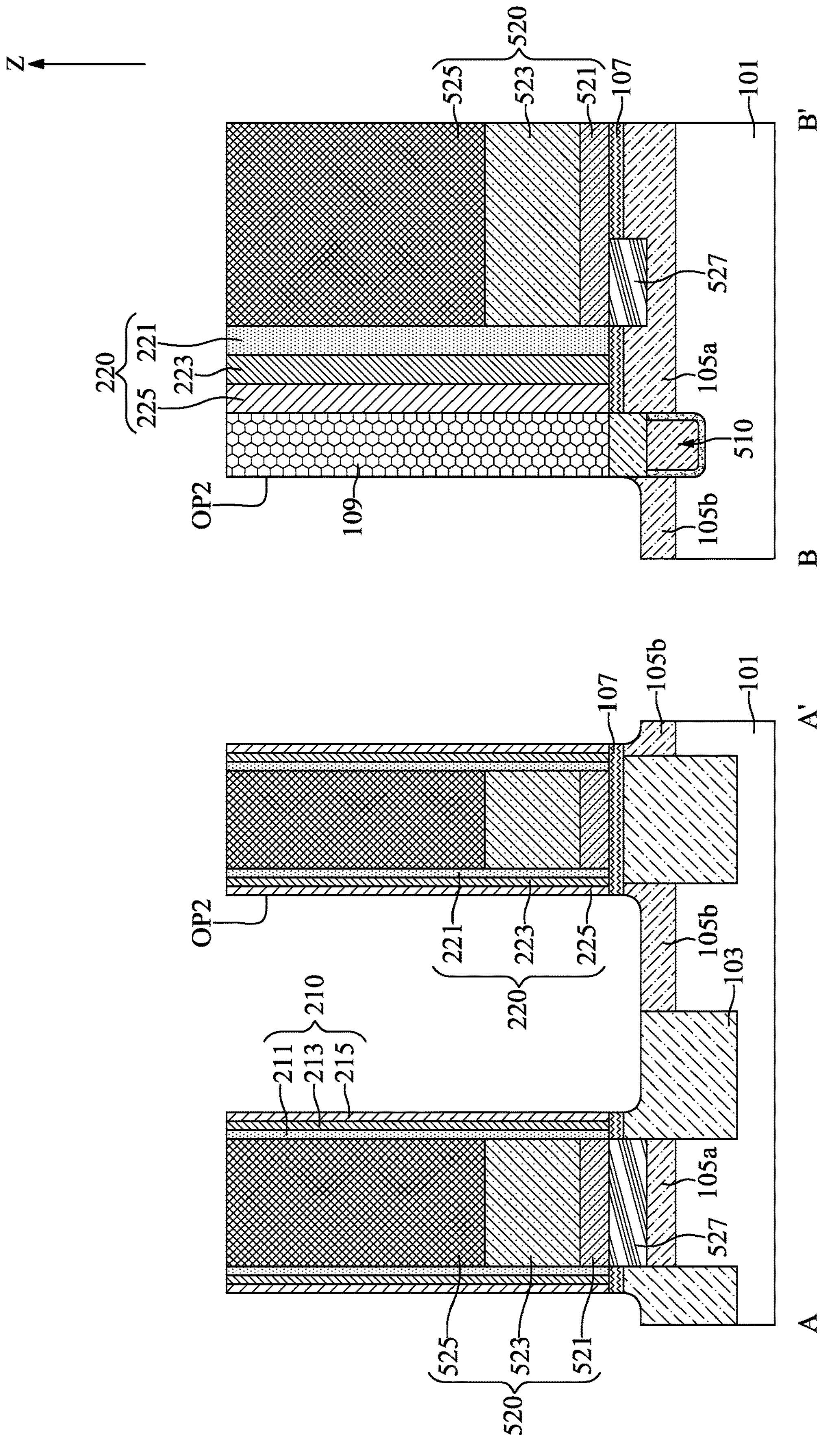
FIGS. 22 to 25 are schematic cross-sectional view diagrams taken along lines A-A' and B-B' in FIG. 21 illustrating part of the flow for fabricating the semiconductor device in accordance with one embodiment of the present disclosure.

With reference to FIGS. 21 and 22, a punch-through etching process may be performed to remove portions of the bottom insulating layer 107 that exposes through the plurality of cell contact openings OP2. In some embodiments, the punch-through etching process may be an anisotropic dry etching process. The punch-through etching process may extend the plurality of cell contact openings OP2 downward to the substrate 101. After the punch-through etching process, the plurality of drain regions 105*b* may be exposed through the plurality of cell contact openings OP2.

Figure 23:
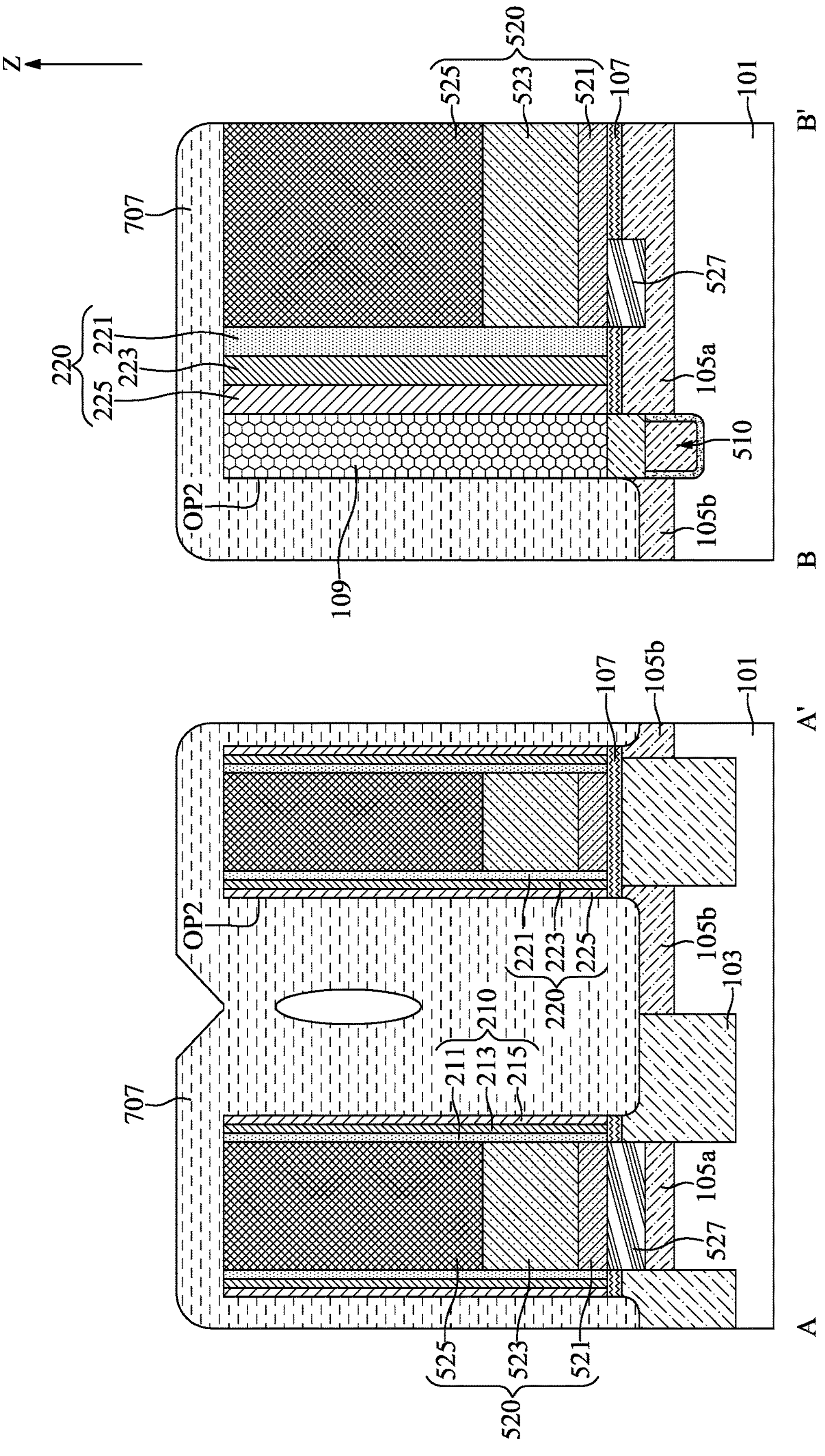

With reference to FIG. 23, a layer of bottom conductive material 707 may be formed to cover the substrate 101, the bit line structure 520, the first spacer structure 210, the second spacer structure 220, and the partition layer 109. In some embodiments, the bottom conductive material 707 may be, for example, doped polycrystalline silicon, doped polycrystalline germanium, or doped polycrystalline silicon germanium. In some embodiments, the bottom conductive material 707 may include p-type dopants or n-type dopants. In some embodiments, the bottom conductive material 707 may be formed by, for example, atomic layer deposition, chemical vapor deposition, or other applicable deposition processes. By employing doped polycrystalline silicon, doped polycrystalline germanium, or doped polycrystalline silicon germanium for the cell contact, the junction leakage may be reduced. As a result, the performance of the semiconductor device 1A may be improved.

Figure 24:
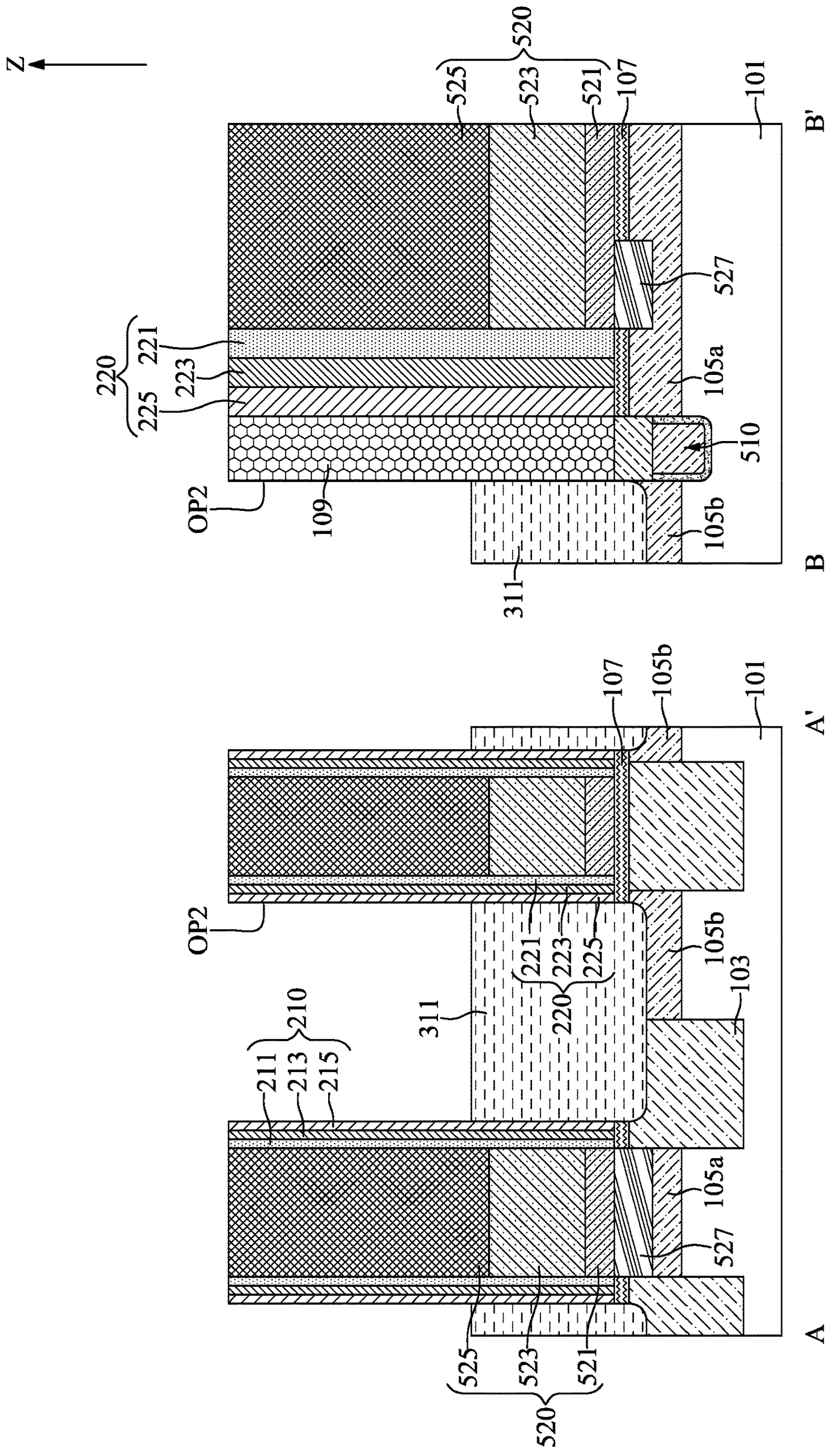

With reference to FIG. 24, an etching back process may be performed to remove portions of the bottom conductive material 707. After the etching back process, the remaining bottom conductive material 707 may be turned into a plurality of bottom cell contacts 311 within the plurality of contact openings OP2, respectively and correspondingly.

Figure 25:
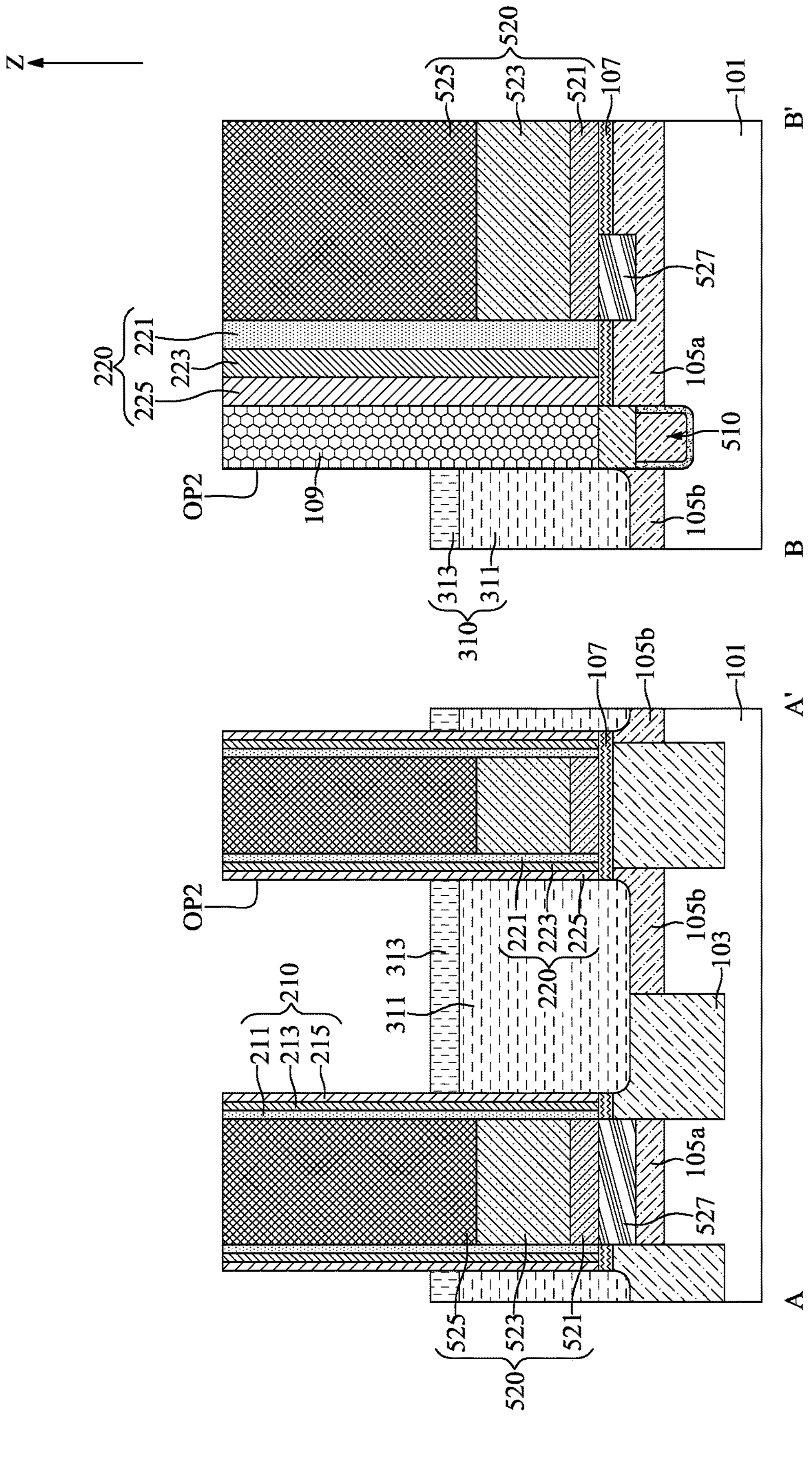

With reference to FIG. 25, a layer of conductive material (not shown) may be formed over the substrate 101. The conductive material may include, for example, titanium, nickel, platinum, tantalum, or cobalt. A thermal treatment may be subsequently performed. During the thermal treatment, metal atoms of the layer of conductive material may react chemically with silicon atoms of plurality of bottom cell contacts 311 to form a plurality of top cell contacts 313.

The plurality of top cell contacts 313 may include titanium silicide, nickel silicide, nickel platinum silicide, tantalum silicide, or cobalt silicide. The thermal treatment may be a dynamic surface annealing process. After the thermal treatment, a cleaning process may be performed to remove the unreacted conductive material. The cleaning process may use etchant such as hydrogen peroxide and an SC-1 solution. In some embodiments, the thickness of the plurality of top cell contacts 313 may be between about 2 nm and about 20 nm. The plurality of bottom cell contacts 311 and the plurality of top cell contacts 313 together configure the plurality of cell contact structures 310.

Figure 26:
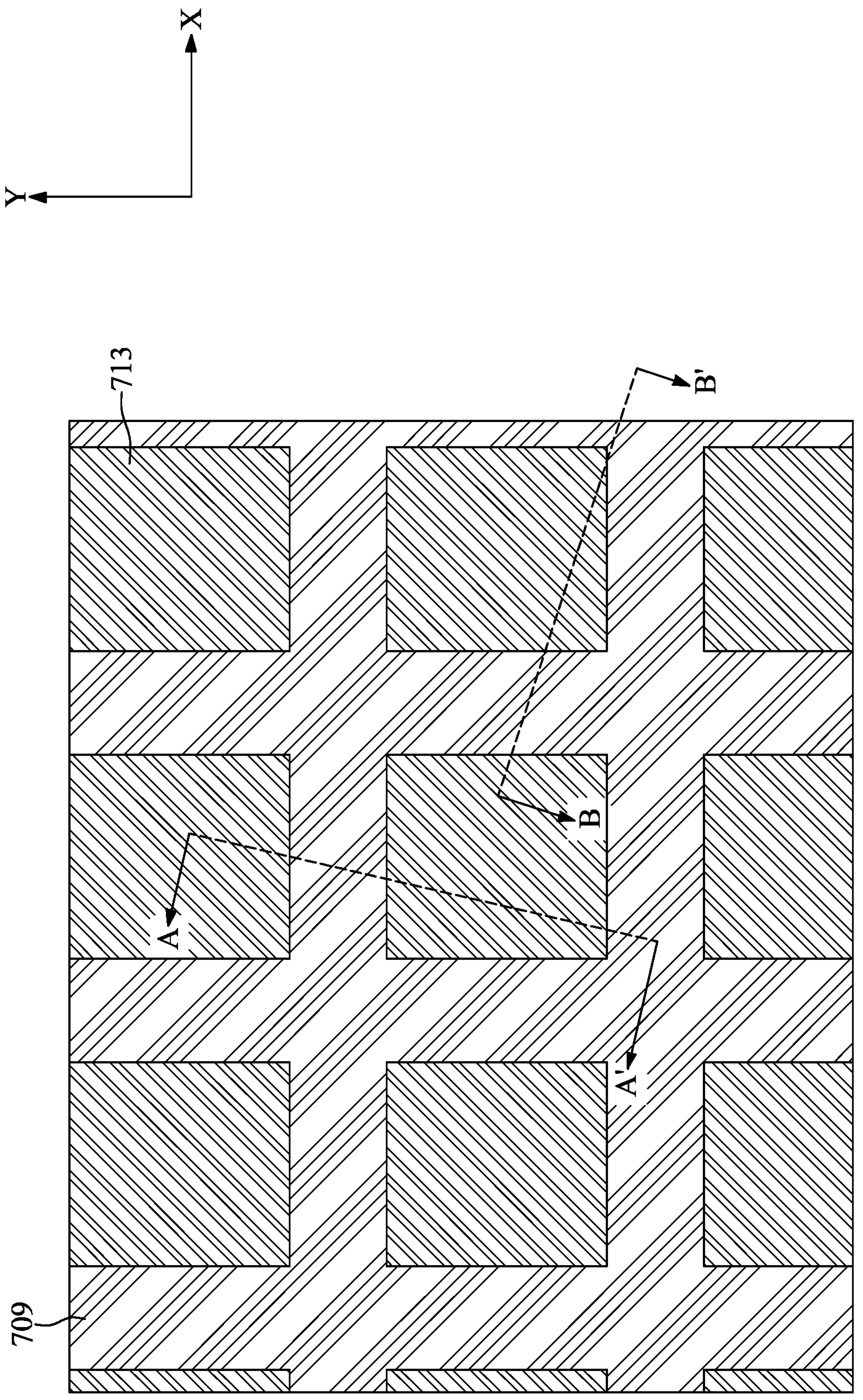
FIG. 26 illustrates, in a schematic top-view diagram, an intermediate semiconductor device in accordance with one embodiment of the present disclosure.
Figure 27:
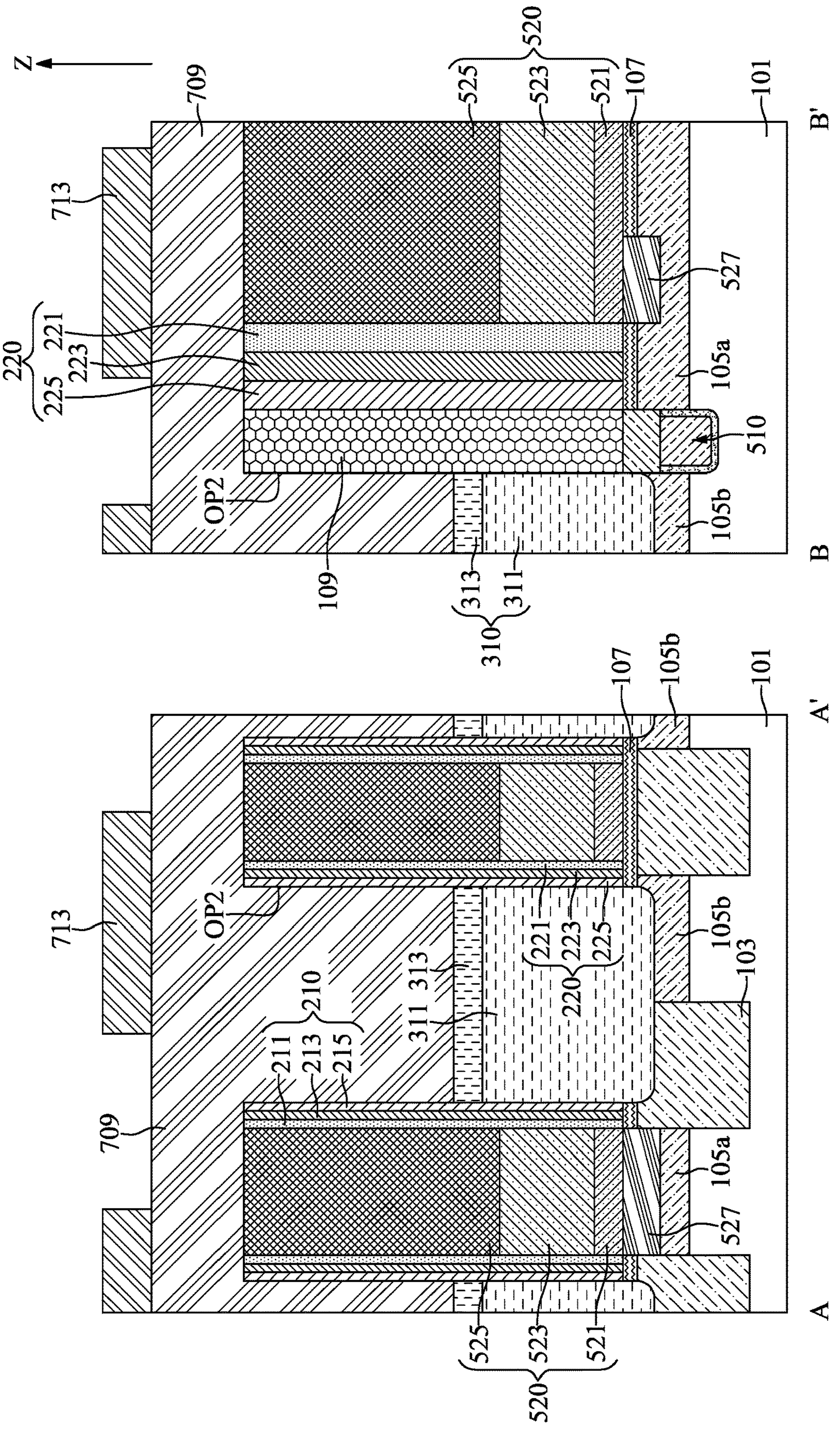
FIG. 27 is a schematic cross-sectional view diagram taken along lines A-A' and B-B' in FIG. 26.
Figure 28:
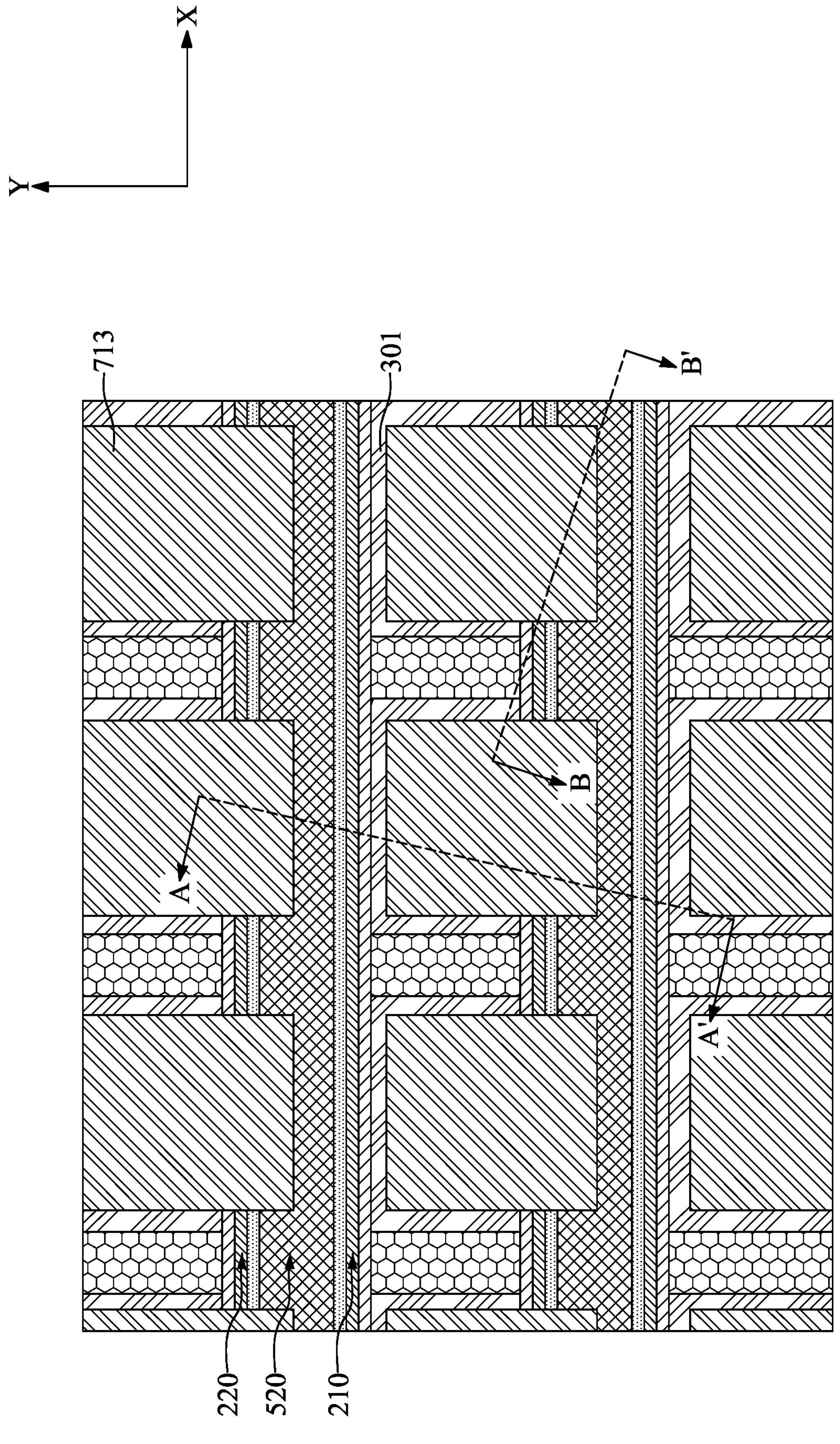
FIG. 28 illustrates, in a schematic top-view diagram, an intermediate semiconductor device in accordance with one embodiment of the present disclosure.
Figure 29:
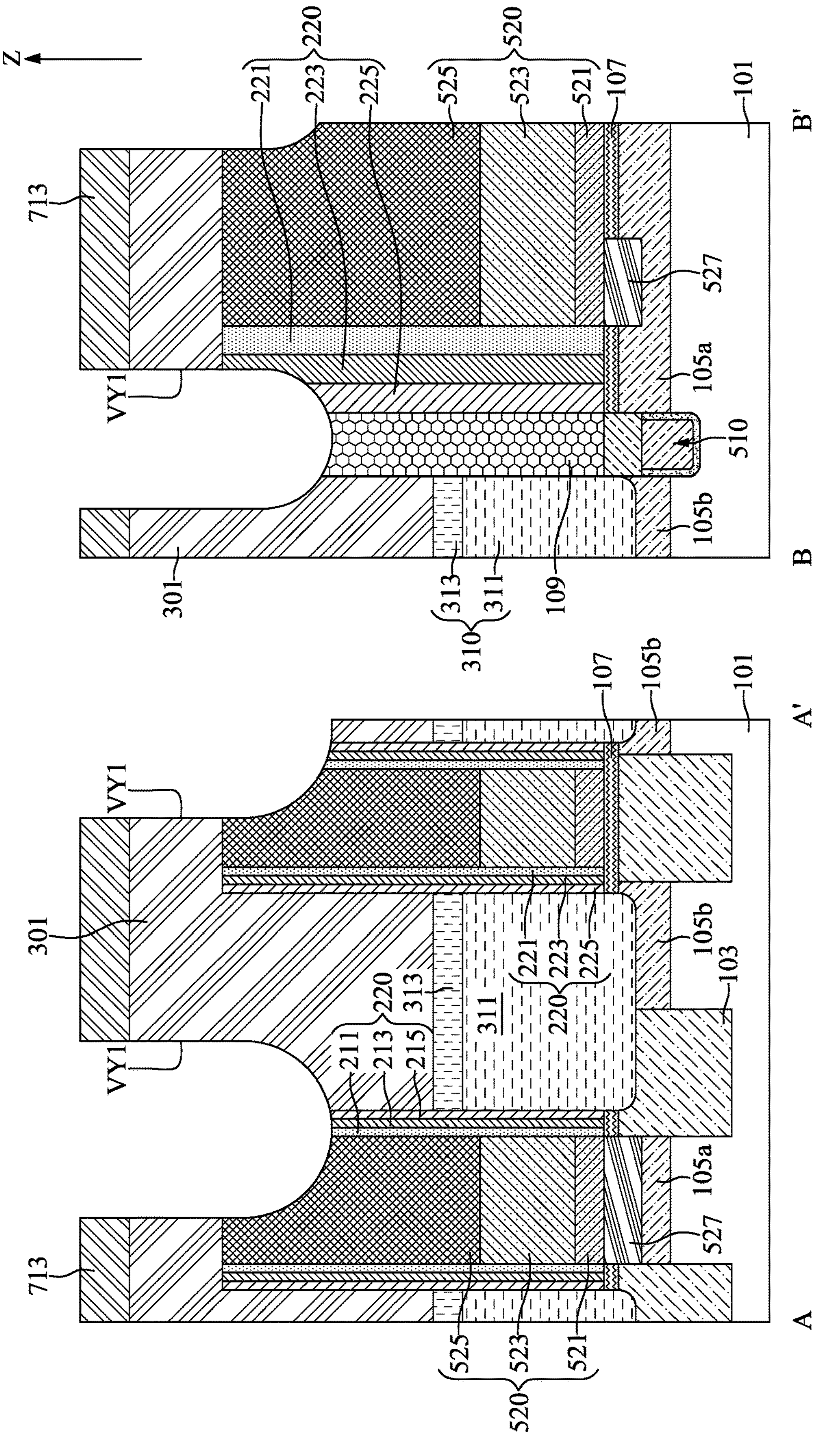
FIG. 29 is a schematic cross-sectional view diagram taken along lines A-A' and B-B' in FIG. 28.
Figure 30:
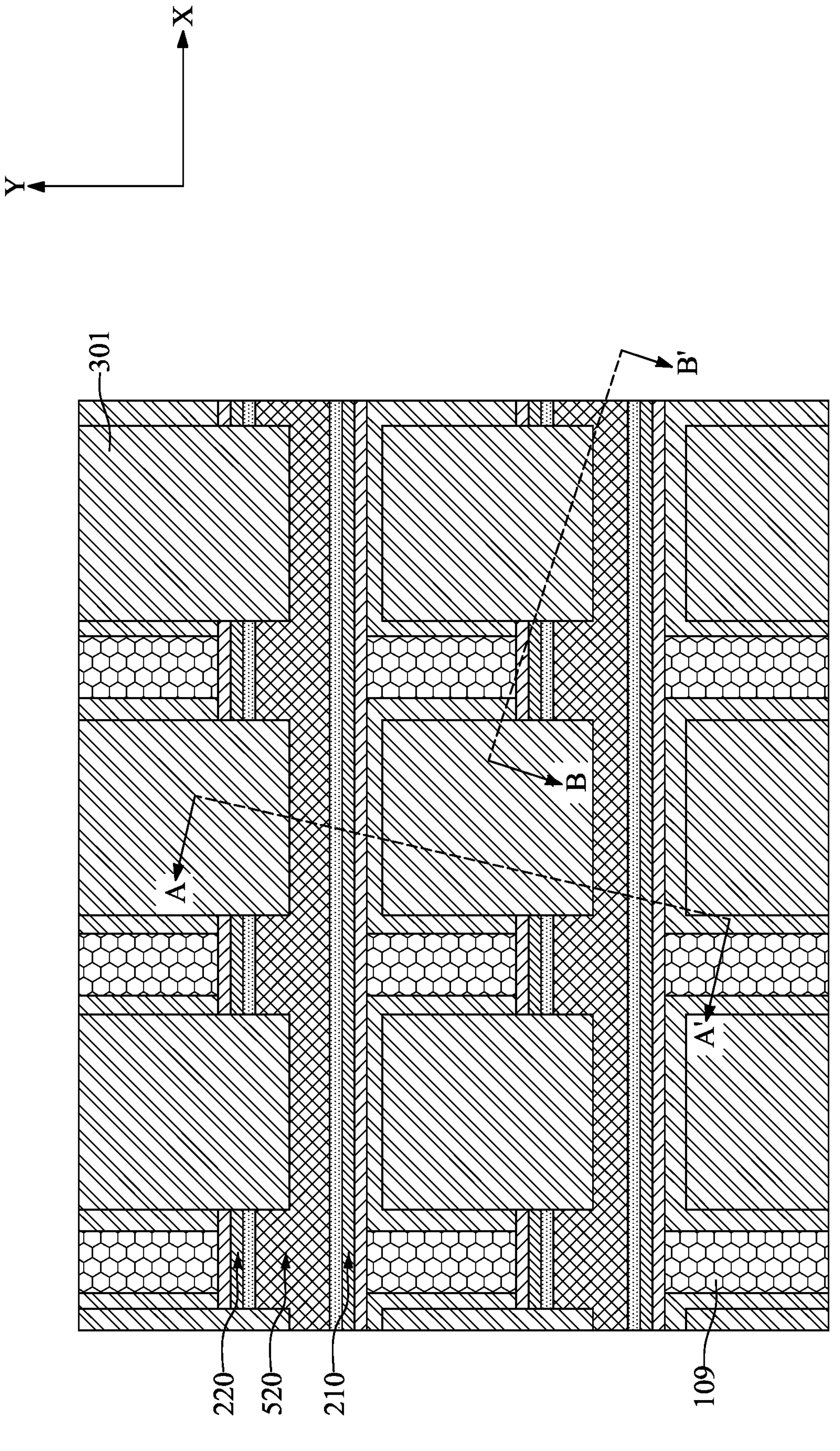
FIG. 30 illustrates, in a schematic top-view diagram, an intermediate semiconductor device in accordance with one embodiment of the present disclosure.
Figure 31:
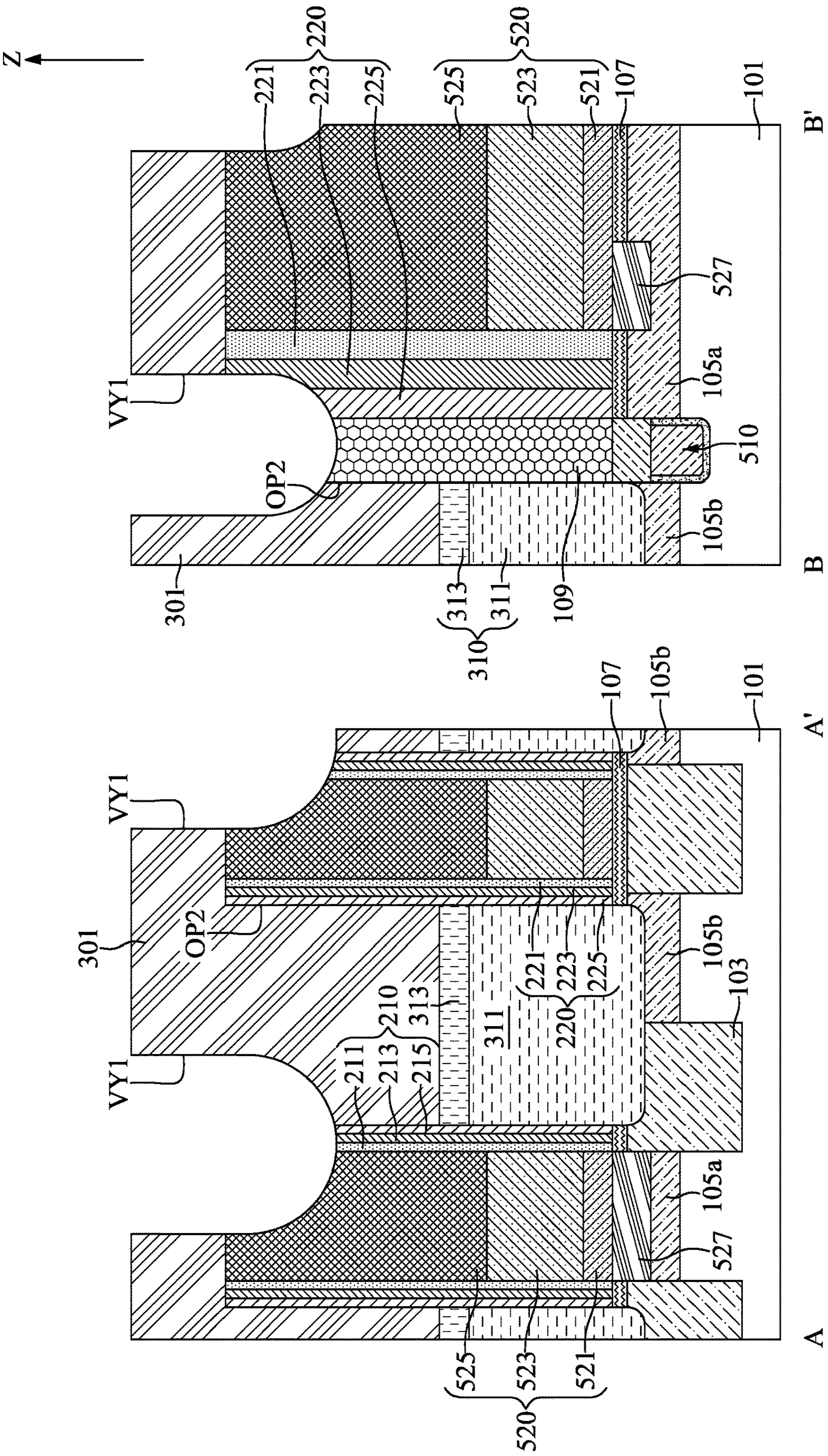
FIG. 31 is a schematic cross-sectional view diagram taken along lines A-A' and B-B' in FIG. 30.

FIG. 26 illustrates, in a schematic top-view diagram, an intermediate semiconductor device in accordance with one embodiment of the present disclosure. FIG. 27 is a schematic cross-sectional view diagram taken along lines A-A' and B-B' in FIG. 26. FIG. 28 illustrates, in a schematic top-view diagram, an intermediate semiconductor device in accordance with one embodiment of the present disclosure. FIG. 29 is a schematic cross-sectional view diagram taken along lines A-A' and B-B' in FIG. 28. FIG. 30 illustrates, in a schematic top-view diagram, an intermediate semiconductor device in accordance with one embodiment of the present disclosure. FIG. 31 is a schematic cross-sectional view diagram taken along lines A-A' and B-B' in FIG. 30.

With reference to FIG. 1 and FIGS. 26 to 31, at step S19, a plurality of landing pads 301, separated by a valley VY1, may be formed within the plurality of cell contact openings OP2.

With reference to FIGS. 26 and 27, a layer of pad material 709 may be formed to completely fill the plurality of cell contact openings OP2 and cover the bit line structure 520, the first spacer structure 210, the second spacer structure 220, and the partition layer 109. In some embodiments, the pad material 709 may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the pad material 709 may be, for example, titanium nitride, titanium, tungsten, or a combination thereof. In some embodiments, the layer of pad material 709 may be formed through multiple deposition processes. For instance, a chemical vapor deposition process, known for its superior gap-filling capability, can be employed to deposit the pad material 709 (e.g., tungsten). Following this, a planarization process is executed to achieve a substantially flat surface. Subsequently, a physical vapor deposition process may be applied to further deposit the pad material 709 over the bit line structure 520. The pad material 709 formed by the physical vapor deposition process is expected to exhibit improved resistance properties.

With reference to FIGS. 26 and 27, a second mask layer 713 may be formed on the layer of pad material 709. In some embodiments, the second mask layer 713 may be a photoresist layer and may include a grid pattern.

With reference to FIGS. 28 and 29, an etching process using the second mask layer 713 as the mask may be performed to remove portions of the pad material 709, the bit line capping layer 525, the partition layer 109, and the first spacer structure 210, resulting in the valley VY1. The valley VY1 may turn the layer of pad material 709 into the plurality of landing pads 301.

With reference to FIGS. 30 and 31, the second mask layer 713 may be removed after the formation of the valley VY1. In some embodiments, the bit line capping layer 525, the first spacer structure 210, the second spacer structure 220, and the partition layer 109 may be exposed through the valley VY1. In some embodiments, as shown in FIG. 30, the partition layer 109 and the first spacer structure 210 may be completely exposed through the valley VY1. The bit line capping layer 525 and the second spacer structure 220 may be partially exposed through the valley VY1. The bit line capping layer 525 and the second spacer structure 220 may be partially covered by the landing pad 301.

Figure 32:
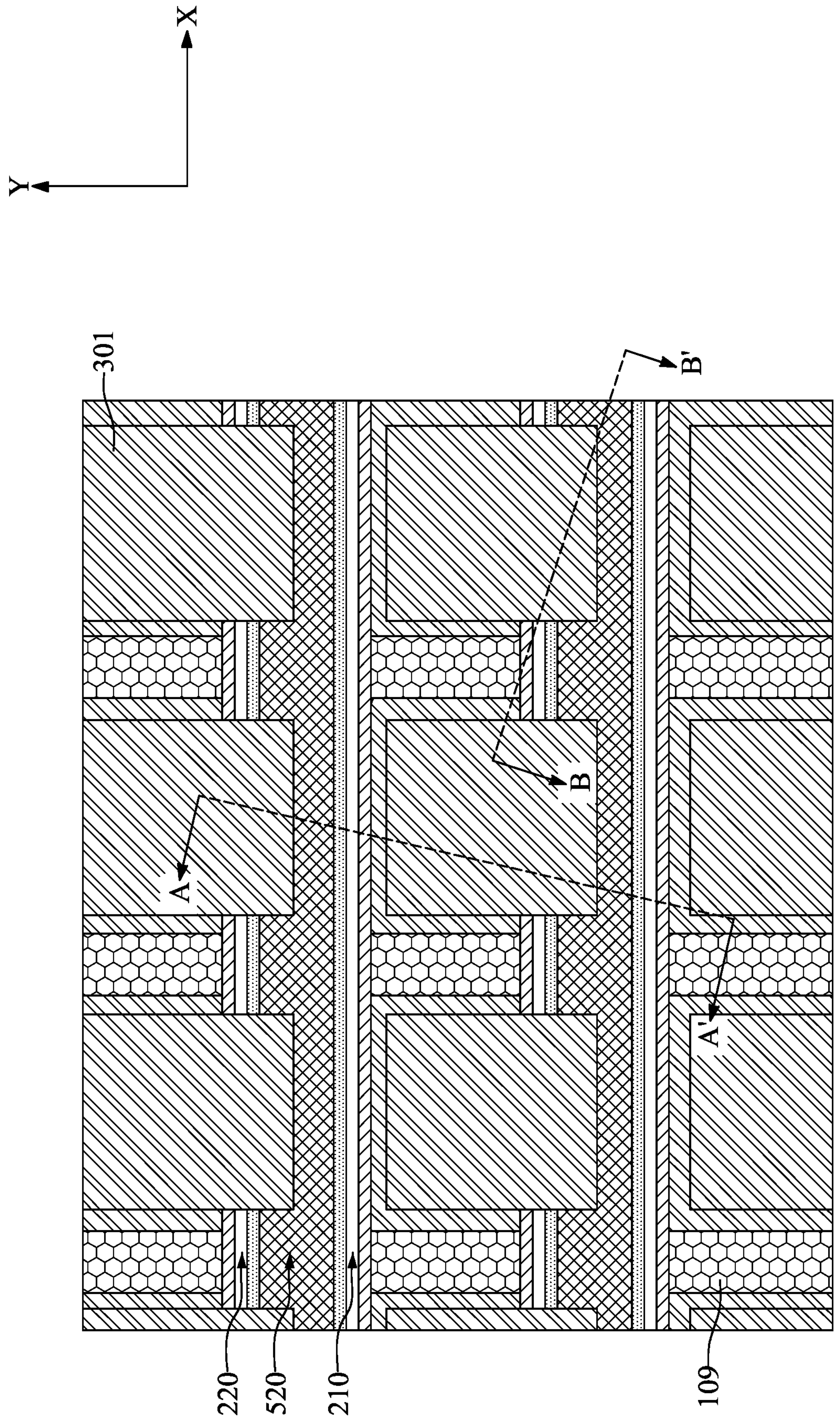
FIG. 32 illustrates, in a schematic top-view diagram, an intermediate semiconductor device in accordance with one embodiment of the present disclosure.

FIG. 32 illustrates, in a schematic top-view diagram, an intermediate semiconductor device in accordance with one embodiment of the present disclosure. FIGS. 33 to 37 are schematic cross-sectional view diagrams taken along lines A-A' and B-B' in FIG. 32 illustrating part of the flow for fabricating the semiconductor device 1A in accordance with one embodiment of the present disclosure.

With reference to FIG. 1 and FIGS. 32 to 34, at step S21, a top dielectric layer 410 may be formed on the plurality of landing pads 301 and partially filling the valley VY1, resulting in a cavity CY1 having an opening OP3.

Figure 33:
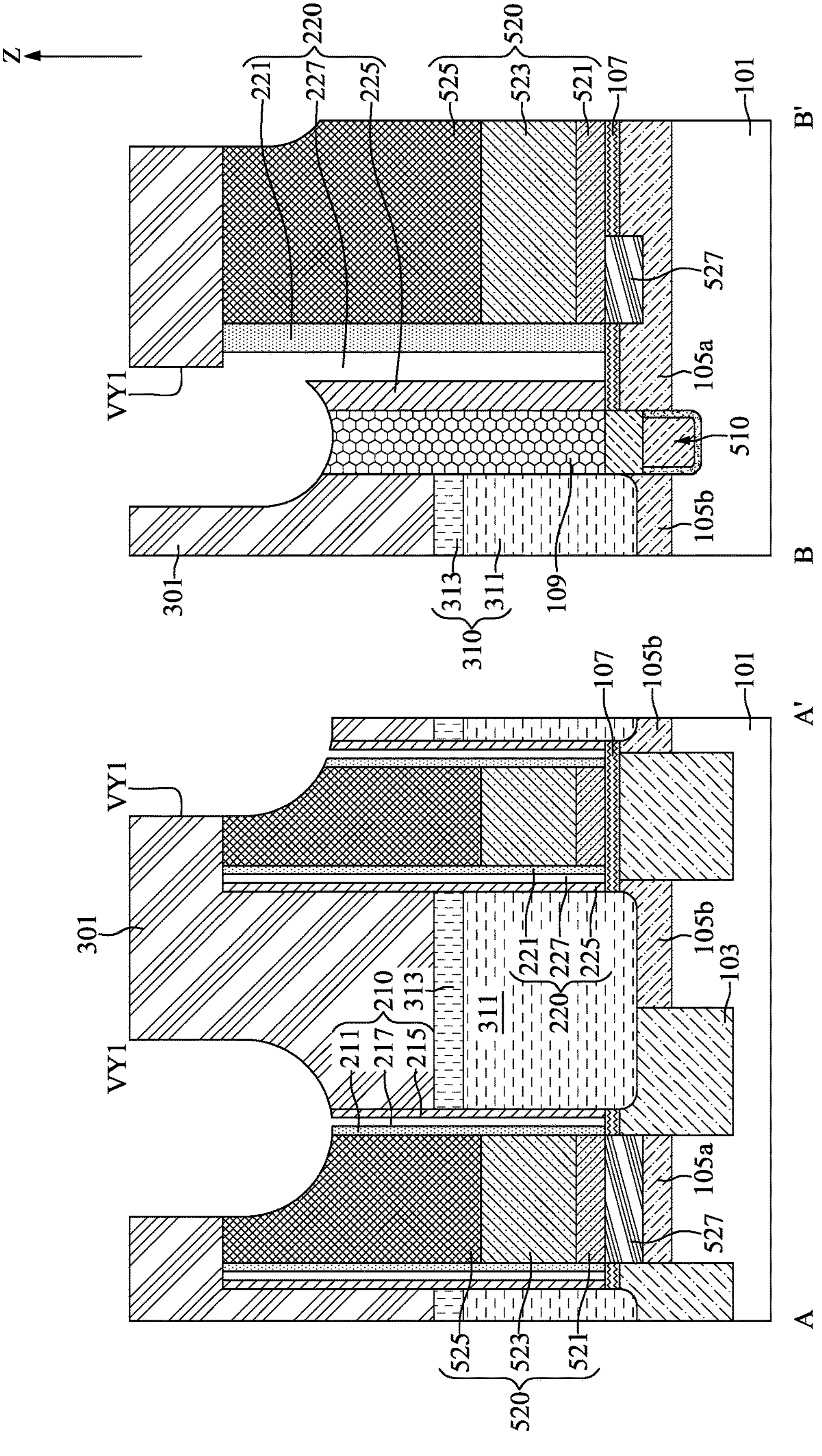
FIGS. 33 to 37 are schematic cross-sectional view diagrams taken along lines A-A' and B-B' in FIG. 32 illustrating part of the flow for fabricating the semiconductor device in accordance with one embodiment of the present disclosure.

With reference to FIGS. 32 and 33, the first middle spacer 213 and the second middle spacer 223 may be selectively removed to form a first space 217 and a second space 227 communicated with the valley VY1. In some embodiments, the selective removal of the first middle spacer 213 and the second middle spacer 223 may be achieved by using vapor hydrogen fluoride, which has etching selectivity to oxide.

Figure 34:
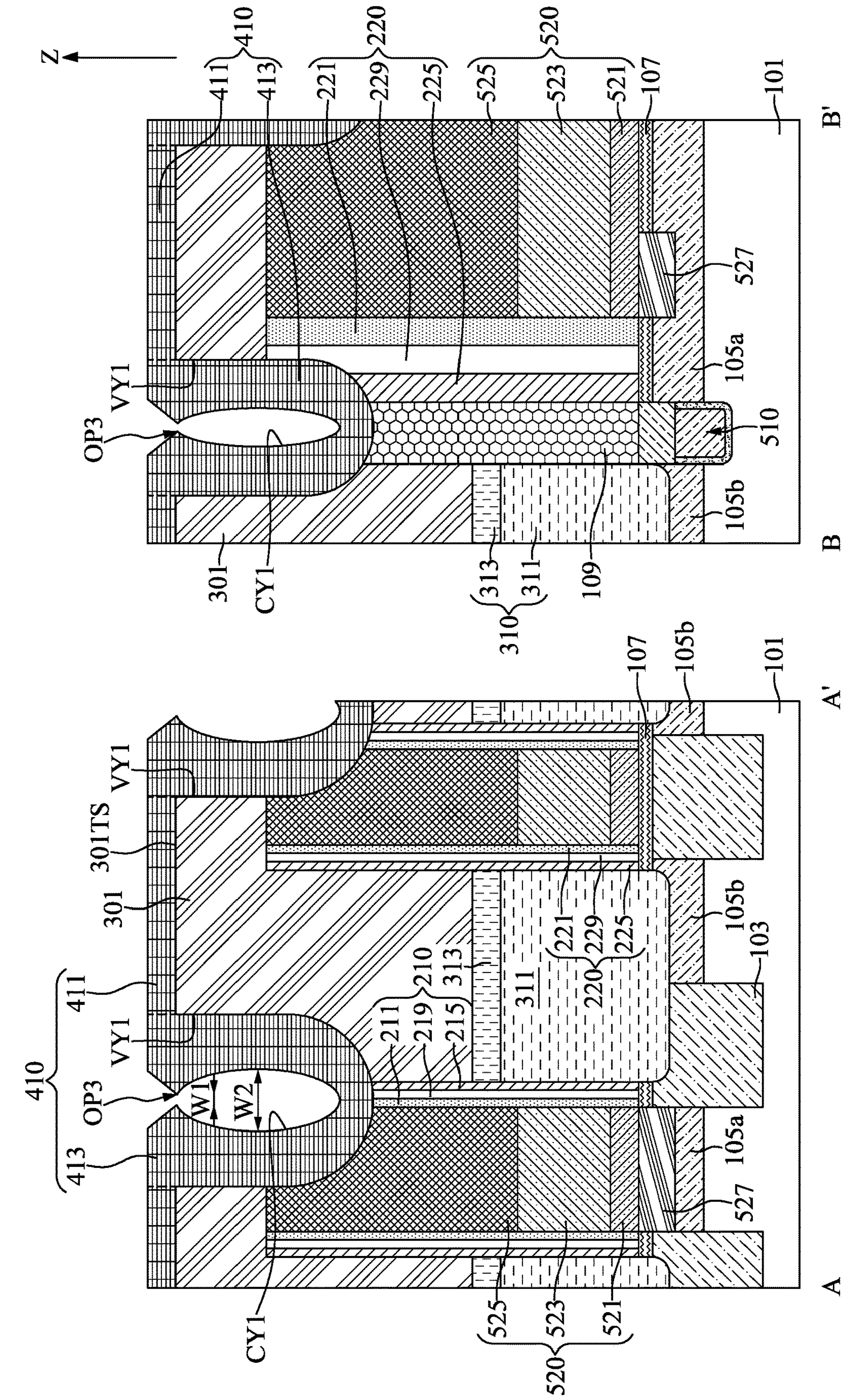

With reference to FIG. 34, the top dielectric layer 410 may be formed on the top surface 301TS of the landing pad 301 and partially filling the valley VY1. Detailedly, the top dielectric layer 410 may include a flat portion 411 and a cavity portion 413. The flat portion 411 is formed on the top surface 301TS of the landing pad 301, while the cavity portion 413 extends from the flat portion 411 into the valley VY1, resulting in the cavity CY1, in which includes the opening OP3. In some embodiments, the top dielectric layer 410 may be formed of, for example, silicon nitride or other applicable insulating materials. In some embodiments, the top dielectric layer 410 may be formed by, for example, chemical vapor deposition, physical vapor deposition, or a combination thereof. In some embodiments, the width W1 of the opening OP3 may be less than the width W2 of the cavity CY1. The small opening OP3 may increase the difficulty for filling the cavity CY1.

In some embodiments, the top dielectric layer 410 may not be a conformal layer so that can provide a better sealing for the valley VY1 and the first space 217 and second space 227. The sealed first space 217 may be referred to as a first air gap 219 and the sealed second space 227 may be referred to as a second air gap 229. The first inner spacer 211, the first air gap 219, and the first outer spacer 215 configure the first spacer structure 210. The second inner spacer 221, the second air gap 229, and the second outer spacer 225 configure the second spacer structure 220. The first air gap 219 and the second air gap 229 may reduce parasitic capacitance between adjacent bit line structures 520.

In some embodiments, the top surface 210TS of the first spacer structure 210 may be lower than the top surface 220TS of the second spacer structure 220.

When the cavity CY1 is not filled properly, the cavity portion 413 may be consumed during following processes to create a channel commuting the cavity CY1 and the air gap 219 and 229. The risk for side etching to the inner spacers 211 and 221 may be increased. As a result, the risk of leakage between capacitors and the bit line structures 520 may also be increased.

With reference to FIG. 1 and FIGS. 35 to 37, at step S23, a protecting element 701 may be formed to partially fill the cavity CY1, the opening OP3 may be broadened to form a broadened opening OP4, the protecting element 701 may be removed, and a filling layer 420 may be formed to fill the cavity CY1.

Figure 35:
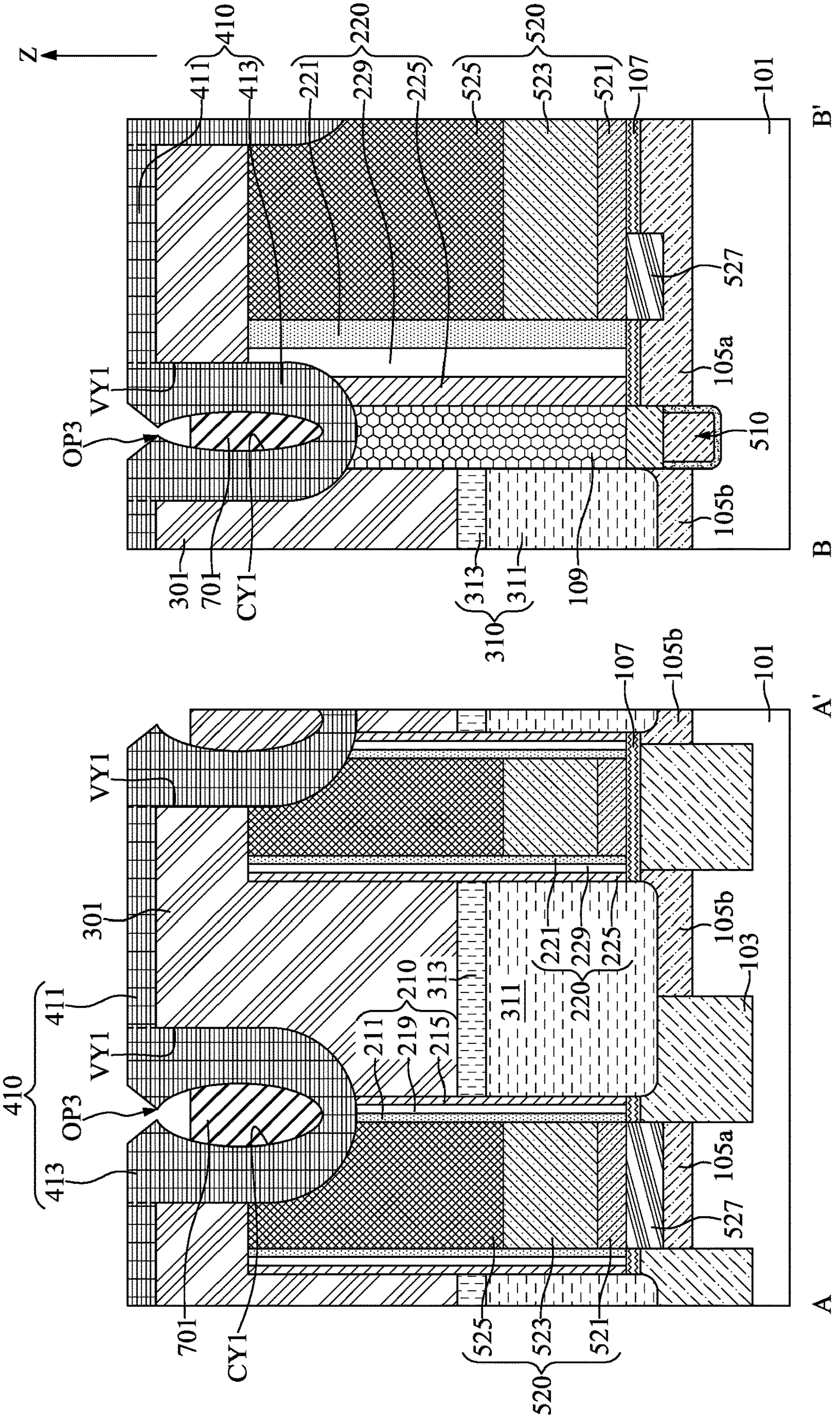

With reference to FIG. 35, the protecting element 701 may partially fill the bottom portion of the cavity CY1, serving as temporary protection. This ensures that the bottom portion of the cavity CY1 remains unaffected during the subsequent broadening process. In some embodiments, the protecting element 701 may consist of a high viscosity and high-density chemical, facilitating its entry into the narrow opening OP3 to partially fill the cavity CY1. Examples of such chemicals may include sulfuric acid, phosphoric acid, or similar substances. In some embodiments, the protecting element 701 may be injected onto the top surface of the intermediate semiconductor device illustrated in FIG. 34, followed by a spin-off process to facilitate its entry into the cavity CY1.

Figure 36:
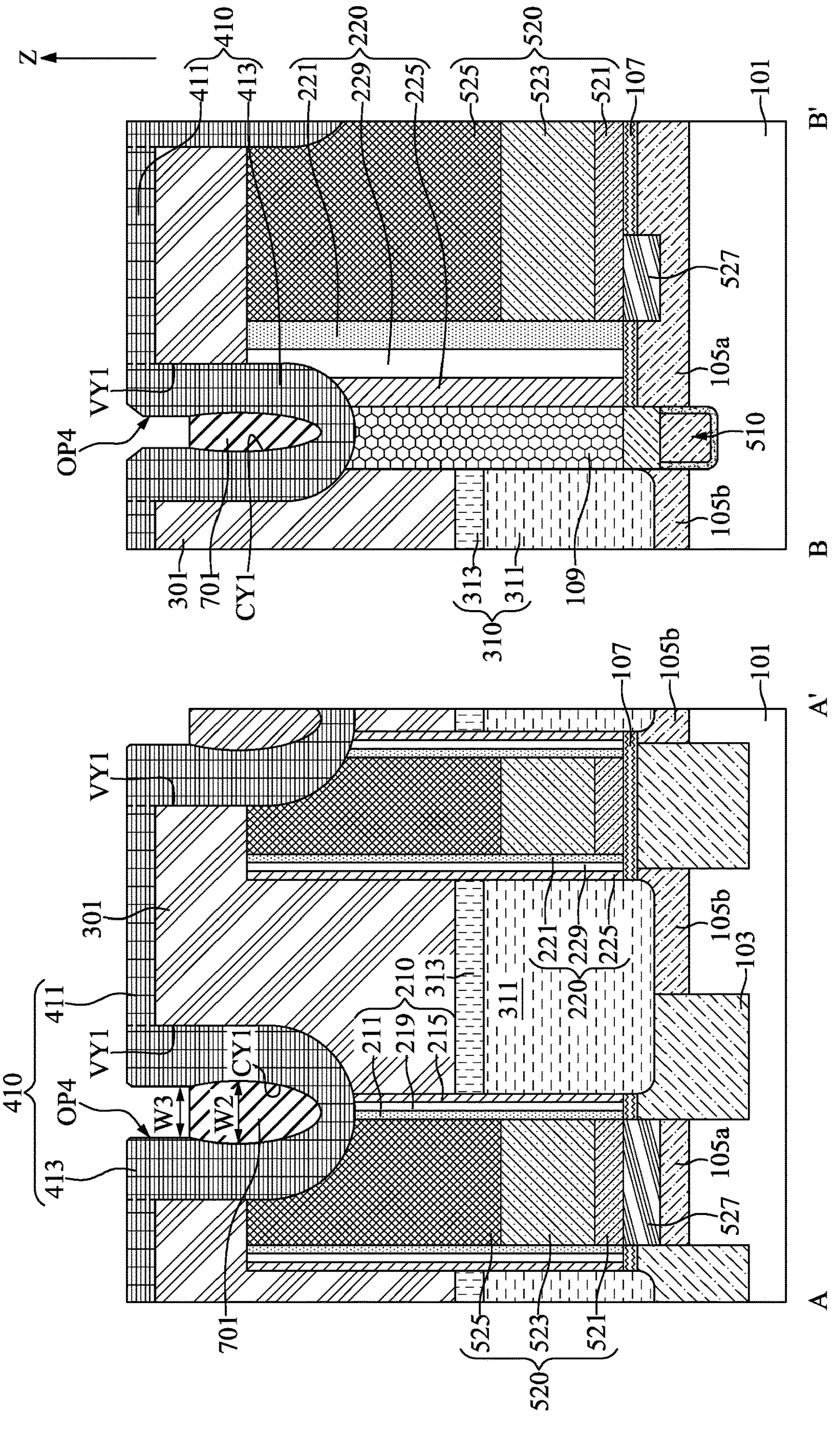

With reference to FIG. 36, an etching process may be performed to broaden the opening OP3 to form the broadened opening OP4. In some embodiments, the etching process may be a wet etching process. In some embodiments, the etching process may include applying dilute hydrofluoric acid solution to the cavity CY1. Due to the protecting element 701 occupying the bottom portion of the cavity CY1, only the top portion of the cavity CY1 (i.e., near the opening OP3) may be removed. As a result, the opening OP3 is broadened to form the broadened opening OP4. In some embodiments, the width W2 of the cavity CY1 and the width W3 of the broadened opening OP4 may be substantially the same. In some embodiments, the width W2 of the cavity CY1 may be less than the width W3 of the broadened opening OP4. In some embodiments, the width ratio of the width W3 of the broadened opening OP4 to the width W2 of the cavity CY1 may be between about 0.80 and about 1.20, between about 0.85 and about 1.05, or between about 0.90 and about 1.00.

With reference to FIG. 36, after the formation of the broadened opening OP4, the protecting element 701 may be removed. In some embodiments, the removal of the protecting element 701 may include applying deionized water to the cavity CY1.

Figure 37:
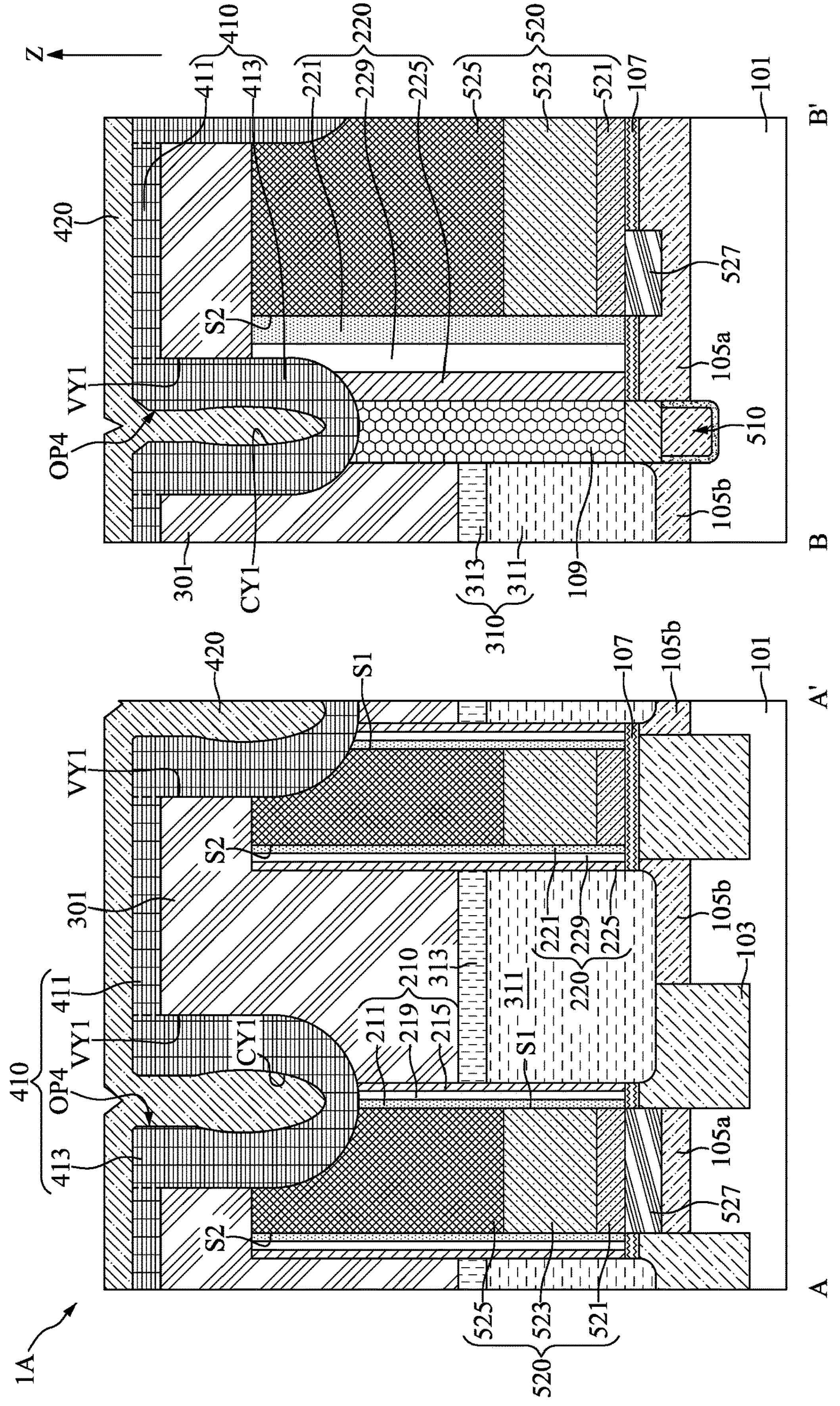

With reference to FIG. 37, the filling layer 420 may be formed on the top dielectric layer 410 and fill the cavity CY1. In some embodiments, the cavity CY1 may be completely filled by the filling layer 420. In some embodiments, the filling layer 420 may be formed of the same material as the top dielectric layer 410. In some embodiments, the filling layer 420 may be formed of, for example, silicon nitride or other applicable insulating materials. In some embodiments, the filling layer 420 may be formed by, for example, chemical vapor deposition, atomic layer deposition, or other applicable deposition processes.

As the cavity CY1 is completely filled, the underlying air gaps 219 and 229 may be properly protected, eliminating the risk of exposure during subsequent processes such as capacitor formation. Consequently, defects such as leakage between the capacitor and the bit line structure in the semiconductor device 1A may be reduced.

Furthermore, due to the broader broadened opening OP4, the filling layer 420 may easily fill the cavity CY1. For example, the cavity CY1 may be filled using only one deposition process instead of multiple deposition and etching cycles. As a result, the complexity and time for fabricating the semiconductor device 1A may be reduced.

Figure 38:
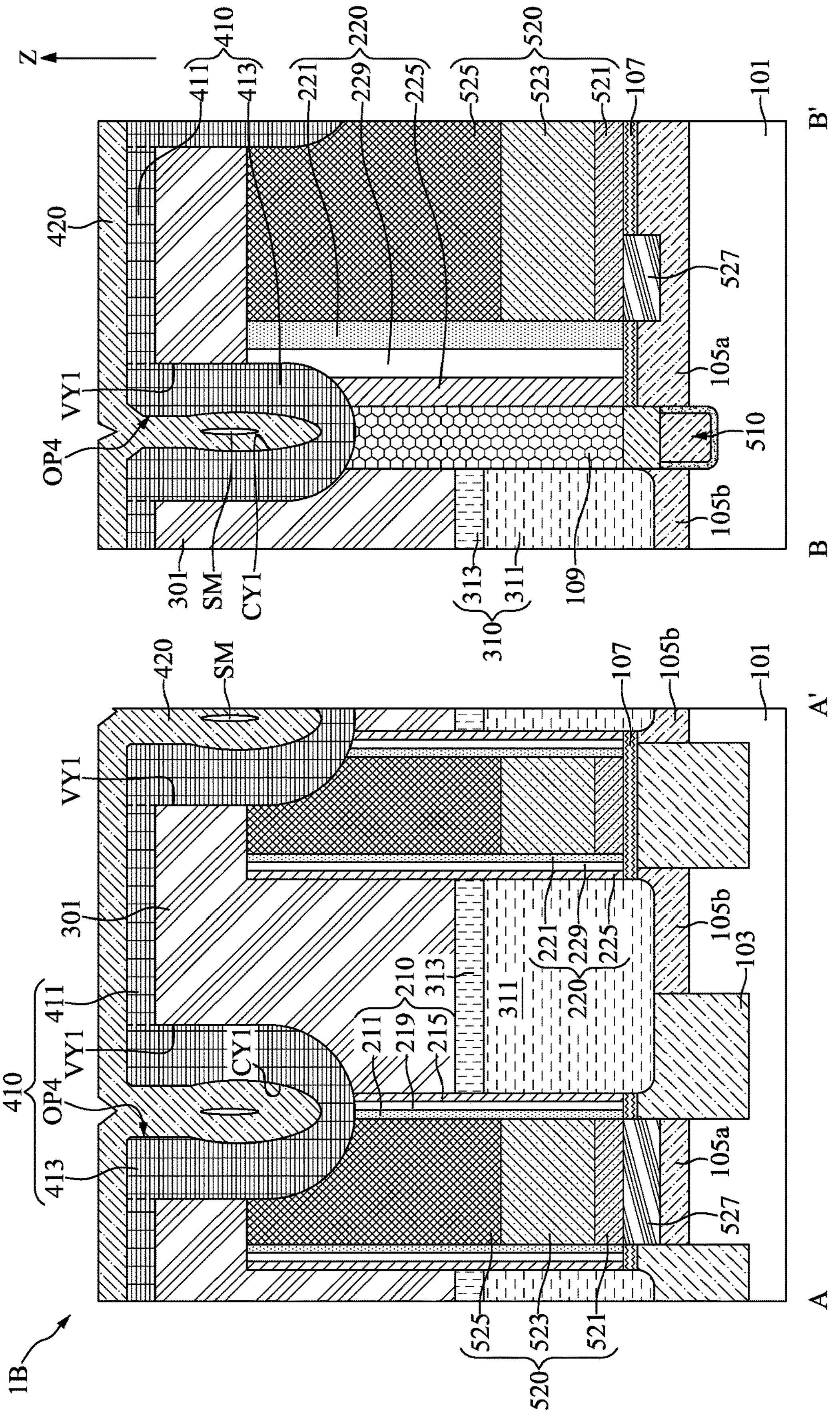
FIGS. 38 and 39 illustrate, in schematic cross-sectional view diagrams, semiconductor devices in accordance with some embodiments of the present disclosure.
Figure 39:
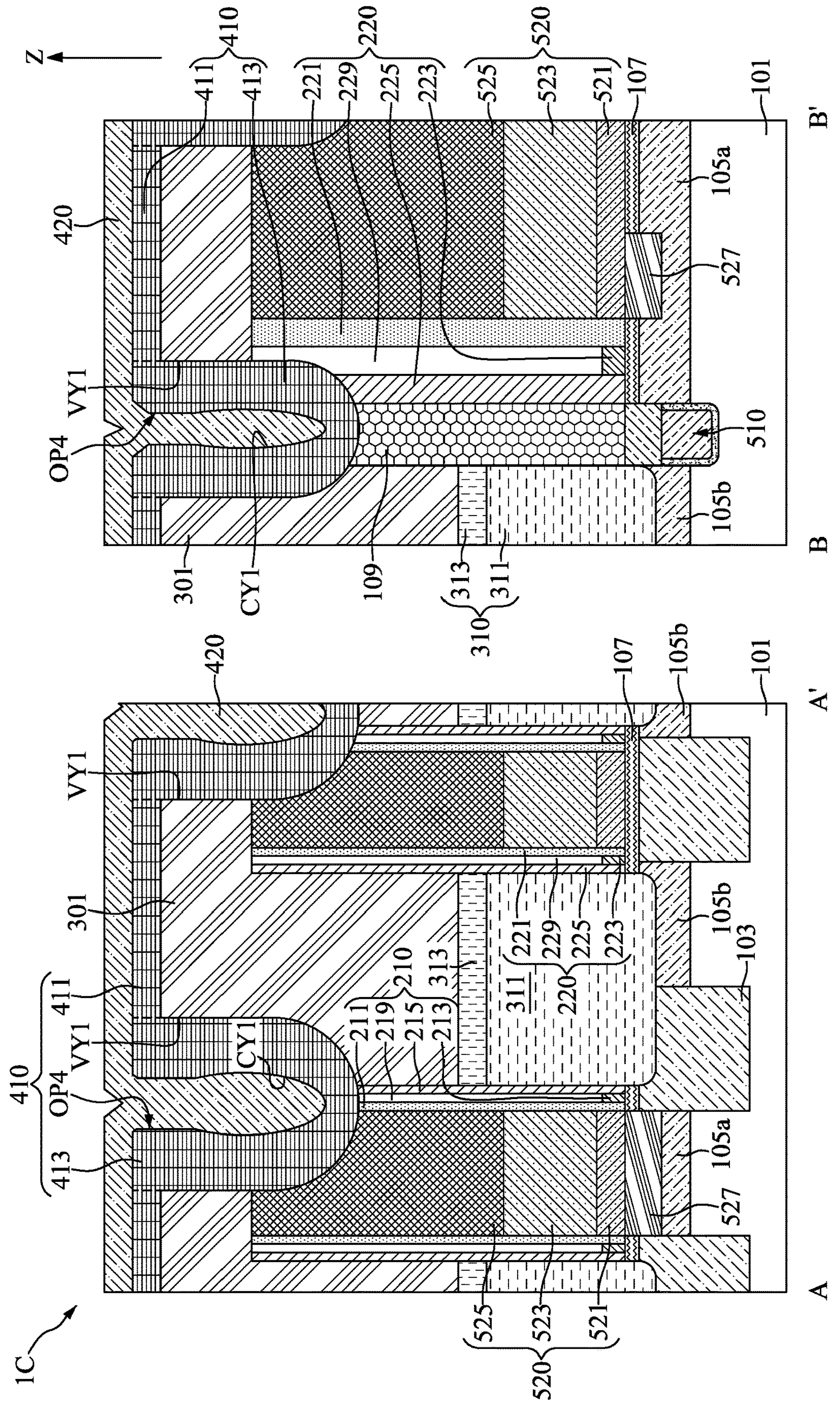

FIGS. 38 and 39 illustrate, in schematic cross-sectional view diagrams, semiconductor devices 1B and 1C in accordance with some embodiments of the present disclosure.

With reference to FIG. 38, the semiconductor device 1B may have a structure similar to that illustrated in FIG. 37. The same or similar elements in FIG. 38 as in FIG. 37 have been marked with similar reference numbers and duplicative descriptions have been omitted.

In the semiconductor device 1B, the cavity CY1 may not be completely filled by the filling layer 420, resulting in seam(s) SM within the filling layer 420. In some embodiments, the volume ratio of the volume of the seam(s) SM to the volume of the cavity CY1 may be less than 1%.

With reference to FIG. 39, the semiconductor device 1C may have a structure similar to that illustrated in FIG. 37. The same or similar elements in FIG. 39 as in FIG. 37 have been marked with similar reference numbers and duplicative descriptions have been omitted.

In the semiconductor device 1C, the first middle spacer 213 and the second middle spacer 223 may not be completely removed during the process illustrated in FIGS. 32 and 33. The first middle spacer 213 may be disposed between the first inner spacer 211 and the first outer spacer 215 and disposed under the first air gap 219. The second middle spacer 223 may be disposed between the second inner spacer 221 and the second outer spacer 225 and disposed under the second air gap 229. The first inner spacer 211, the first middle spacer 213, the first outer spacer 215, and the first air gap 219 configure the first spacer structure 210. The second inner spacer 221, the second middle spacer 223, the second outer spacer 225, and the second air gap 229 configure the second spacer structure 220.

The first middle spacer 213 and the second middle spacer 223 may serve as protective layers for the underlying layers. In addition, the dielectric constant of the first spacer structure 210 and the second spacer structure 220 can be fine-tuned by adjusting the thickness of the first middle spacer 213 and the second middle spacer 223. In other words, the electrical characteristics of the semiconductor device 1C can be elaborately controlled through the use of the first middle spacer 213 and the second middle spacer 223.

One aspect of the present disclosure provides a top dielectric layer including a flat portion positioned on a top surface of a landing pad; and a cavity portion connecting to the flat portion, surrounding the landing pad in a top-view perspective, and including a U-shaped cross-sectional profile in a cross-sectional perspective, resulting in a cavity with a broadened opening. A width of the cavity and a width of the broadened opening are substantially the same.

Another aspect of the present disclosure provides a semiconductor device including a substrate; a landing pad positioned over the substrate; a top dielectric layer including a flat portion positioned on a top surface of the landing pad, and a cavity portion connecting to the flat portion, surrounding the landing pad in a top-view perspective, recessing toward the substrate in a cross-sectional perspective, and including a U-shaped cross-sectional profile, resulting in a cavity with a broadened opening; and a filling layer positioned on the top dielectric layer and filling the cavity. A width of the cavity and a width of the broadened opening are substantially the same.

Another aspect of the present disclosure provides a method for fabricating a semiconductor device including forming a landing pad over a substrate; forming a top dielectric layer covering the landing pad, wherein the top dielectric layer includes a flat portion on a top surface of the landing pad and a cavity portion surrounding the landing pad, the cavity portion includes a U-shaped cross-sectional profile, resulting in a cavity with an opening, and a width of the opening is less than a width of the cavity; partially filling the cavity with a protecting element; broadening the opening into a broadened opening, wherein the width of the cavity and a width of the broadened opening are substantially the same; removing the protecting element; and forming filling layer on the top dielectric layer and filling the cavity.

Due to the design of the semiconductor device of the present disclosure, the cavity CY1 may be completely filled by the filling layer 420 so that the underlying air gaps 219 and 229 may be properly protected. Hence, the risk of exposure during subsequent processes such as capacitor formation may be eliminated. Consequently, defects such as leakage between the capacitor and the bit line structure in the semiconductor device 1A may be reduced. Furthermore, due to the broader broadened opening OP4, the filling layer 420 may easily fill the cavity CY1. As a result, the complexity and time for fabricating the semiconductor device 1A may be reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:

forming a landing pad over a substrate;

forming a top dielectric layer covering the landing pad, wherein the top dielectric layer comprises a flat portion on a top surface of the landing pad and a cavity portion surrounding the landing pad, the cavity portion comprises a U-shaped cross-sectional profile, resulting in a cavity with an opening, and a width of the opening is less than a width of the cavity;

partially filling the cavity with a protecting element;

broadening the opening into a broadened opening, wherein the width of the cavity and a width of the broadened opening are the same;

removing the protecting element; and forming filling layer on the top dielectric layer and filling the cavity.

2. The method for fabricating the semiconductor device of claim 1, further comprising:

forming at least two bit line structures on the substrate, separated from each other, and respectively extending along a first direction in a top-view perspective;

forming at least two partition layers on the substrate, separated from each other, and respectively extending along a second direction perpendicular to the first direction, wherein the at least two partition layers and the at least two bit line structures collectively enclose a cell contact opening;

forming a cell contact structure within the cell contact opening; and forming the landing pad on the cell contact structure and partially extending onto one of the at least two bit line structures.

3. The method for fabricating the semiconductor device of claim 2, wherein the protecting element comprises sulfuric acid or phosphoric acid.

4. The method for fabricating the semiconductor device of claim 3, wherein the broadening the opening is achieved by a wet etching process.

5. The method for fabricating the semiconductor device of claim 4, wherein the wet etching process comprises applying dilute hydrofluoric acid solution to the cavity.

6. The method for fabricating the semiconductor device of claim 5, wherein removing the protecting element comprises applying deionized water to the cavity.

7. The method for fabricating the semiconductor device of claim 6, wherein the top dielectric layer and the filling layer comprise the same material.

8. The method for fabricating the semiconductor device of claim 6, wherein the cell contact structure comprises:

a bottom cell contact between the substrate and the landing pad; and a top cell contact between the bottom cell contact and the landing pad.

9. The method for fabricating the semiconductor device of claim 8, wherein bottom cell contact comprises doped polycrystalline silicon, doped polycrystalline germanium, or doped polycrystalline silicon germanium and the top cell contact comprises titanium silicide, nickel silicide, nickel platinum silicide, tantalum silicide, or cobalt silicide.

10. The method for fabricating the semiconductor device of claim 6, wherein the filling layer comprises a seam, and a volume ratio of a volume of the seam to a volume of the cavity is less than 1%.

* * * * *